United States Patent [19]
Yamazaki et al.

[11] Patent Number: 5,459,090
[45] Date of Patent: Oct. 17, 1995

[54] SEMICONDUCTOR DEVICE AND METHOD FOR FORMING THE SAME

[75] Inventors: Shunpei Yamazaki, Tokyo; Toshiji Hamatani, Kanagawa, both of Japan

[73] Assignee: Semiconductor Energy Laboratory Co., Ltd., Kanagawa, Japan

[21] Appl. No.: 111,740

[22] Filed: Aug. 25, 1993

Related U.S. Application Data

[63] Continuation of Ser. No. 877,421, May 1, 1992, abandoned.

[30] Foreign Application Priority Data

May 16, 1991 [JP] Japan .................... 3-174269

[51] Int. Cl.$^6$ ................................... H01L 21/265
[52] U.S. Cl. ................ 437/43; 437/15; 437/40; 437/225; 437/235; 257/408; 257/410
[58] Field of Search ............ 357/23.7; 257/350, 257/351, 408, 410; 437/15, 225, 235, 40, 43

[56] References Cited

U.S. PATENT DOCUMENTS

| | | | |
|---|---|---|---|
| 4,040,073 | 8/1977 | Luo | 357/23.7 |
| 4,065,781 | 12/1977 | Gutknecht | 357/23.7 |
| 4,236,167 | 11/1980 | Woods | 357/23.7 |
| 4,336,550 | 6/1982 | Medwin | 257/351 |
| 5,024,960 | 6/1991 | Haken | 257/408 |
| 5,254,866 | 10/1993 | Ogoh | 257/408 |

*Primary Examiner*—Edward Wojciechowicz
*Attorney, Agent, or Firm*—Sixbey, Friedman, Leedom & Ferguson; Gerald J. Ferguson, Jr.; Evan R. Smith

[57] ABSTRACT

A novel structure of TFT is described. In the structure of TFT, an anodic oxidation film, which is a material composing a gate electrode, is laid at the side of gate electrode. An electrode, which is connected to a source, drain region, is in contact with the upper surface and the side of the source, drain region, and extended on the upper surface of an insulation film which is laid on the gate electrode. In the preparation process of TFT, it can be completed by using only two sheets of mask.

10 Claims, 21 Drawing Sheets

5,459,090

SEMICONDUCTOR DEVICE AND METHOD FOR FORMING THE SAME

This application is a continuation of Ser. No. 07/877,421, filed May 1, 1992, now abandoned.

BACKGROUND OF THE INVENTION

1. Field of the Invention

The present invention relates to a semiconductor device and a method for forming the same. Particularly, it is applicable to a liquid crystal electro-optical device or a full contacted image sensor device etc.

2. Description of the Prior Art

So far, the insulated gate field effect semiconductor device has been well known and widely used in various fields. This semiconductor device is formed on a silicon substrate and is utilized as IC or LSI, integrating many semiconductor elements functionally.

On the other hand, a thin film type insulated gate field effect semiconductor device (hereinafter to be referred to as TFT) which is formed by laminating thin films on an insulating substrate has started to be positively used in such parts as a switching element, a driving circuit for a picture element of the liquid crystal electro-optical device, and a reading circuit part of a full contacted image sensor.

As mentioned above, the TFT is formed by laminating thin films on the insulating substrate, using gaseous phase method. The temperature of the forming-atmosphere is such low as around 500° C. even at the highest. Then, it is possible to use cheap soda glass or borosilicate glass etc. as a substrate. Therefore, TFT has such merits as it can be formed on a cheap substrate, its maximum size is limited to only the apparatus size applied to the thin film forming by the gaseous phase method, and it is easy to form a transistor on a large area substrate. Then, it has been expected and also partly realized that the TFT will be applied to a liquid crystal electro-optical device in a matrix structure having a lot of picture elements, and a one-dimensional or two-dimensional image sensor.

FIG. 2 is a schematic diagram showing a typical structure of the conventional TFT, in which reference numeral 1 designates an insulation substrate made of glass, 2 an amorphous thin film semiconductor, and a reference numeral 3 designates a source and a drain region, a reference numeral 7 designates a source and a drain electrode, and a reference numeral 8 designates a gate electrode.

Such TFT is generally prepared as follows. At first, a semiconductor film will be formed on the substrate, and a semiconductor region 2 will be formed into an island shape at a necessary part, by patterning the semiconductor film using the first mask. Then, the gate insulation film material will be formed and the gate electrode material will be formed thereon, and the gate insulation film material and the gate electrode material will be patterned using the second mask to form the gate insulation film 6 and the gate electrode 8.

After that, the source and drain regions 3 will be formed by a self-alignment in the semiconductor region 2, using the mask of photoresist formed with the third mask and the gate electrode 8 as a mask. Then, an interlayer insulating film 4 will be formed. Contact holes will be formed in the interlayer insulating film using the fourth mask, to connect electrodes to the source and drain regions 3. Finally, the electrode 7 will be formed to complete the preparation of TFT, by patterning the electrode material which was previously formed, using the fifth mask.

As described above, it has been needed for the preparation of usual TFT to use five sheets of mask, especially six sheets of mask in case of complementary type TFTs. As a matter of course, the more IC is complicated, the more sheets of mask will be needed. In this way, using many masks requires an intricated process in the preparation of TFT element, and increases inevitably the number of mask alignments, the result being in that it brings about the falling down of yield and productivity of the TFT element preparation. Further, it poses a problem that the large-sizing of an electronic device using the TFT element, and the small-sizing of TFT element itself, and the fine patterning render the above yield and productivity more fall down.

SUMMARY OF THE INVENTION

Accordingly, it is an object of the present invention to provide a novel structure of the insulated gate field effect semiconductor device which can decrease the number of masks needed for the preparation of TFT.

It is another object of the present invention to provide a process which does not need the complicated one for the preparation of TFT.

The present invention, therefore, is concerned with the novel structure of the insulated gate field effect semiconductor device, and with the simple preparation process therefor, which is capable of preparing the TFT with less number of masks compared with the conventional process.

That is, the present invention provides an insulated gate field effect semiconductor device comprising:

an anodic oxidation film being laid around the side of a gate electrode of a TFT, said anodic oxidation film comprising a material of said gate electrode; and electrodes being in contact with the upper surfaces and the sides of source and drain regions, said electrodes being extended covering the upper surface of an insulation film (the anodic oxidation film) laid around the side of said gate electrode.

As shown in FIG. 1 which is a schematic cross-sectional view of the TFT, according to the present invention, the anodic oxidation film 10 is laid at least around the side of the gate electrode 8, The upper and the side surfaces of the source and drain regions 3 protrude a little from the verge surface of the anodic oxidation film. (A total width of the anodic oxidation film and the gate electrode is smaller than width of a semiconductor layer comprising the source and drain regions 3 and a channel 2 in FIG. 1. Also, width of the gate insulating layer of the TFT is smaller than the width of the semiconductor layer.) At this protruded area, the electrodes 7 are connected to the source and drain regions, and it takes a large connective area. Further, the electrode 7 extends to the upper part of the insulation film 11 on the gate electrode 8. At this part, it is patterned and is separated into each electrode.

FIG. 3 indicates a schematic process for the preparation of TFT structure shown in FIG. 1. The diagrams in the specification of the present invention show only outlines for the explanation, and these are a little different from the actual ones in their sizes and shapes. Hereafter, one example of the TFT preparation process of the present invention will be explained in accordance with FIG. 3.

First of all, a semiconductor layer 2 will be formed on a glass substrate 1, e.g., a crystallized glass having a heat resisting properties, as indicated in FIG. 3 (A). As the silicon semiconductor layer, such wide kinds of semiconductor as amorphous, or polycrystal semiconductor are used. As a forming method, it may be selected to use plasma-CVD, sputtering, or heat-CVD method, according to the kind of semiconductor employed. For example, a polycrystal silicon semiconductor is used in the following explanation.

Next, silicon oxide film 8 to be a gate insulating film will be formed on the semiconductor 2, and then a gate electrode material, here used aluminum, will be formed on the silicon oxide 6. Upon this, a silicon oxide film as the insulation film 11 will be formed by sputtering method. After that, the insulation film 11 and the gate electrode 8 will be patterned, using the first mask ①. After that, non porous aluminum oxide 10 will be formed at least around the side of the gate electrode nearby a channel region as shown in FIG. 3(B), by effecting an anodic oxidation around the side area of the electrode 8, in an electrolytic solution for the anodic oxidation.

As the solution for the anodic oxidation, typically, such a strong acid solution as sulfuric, nitric, and phosphoric acid, or a mixed acid solution of such organic acid as tartaric, and citric acid with such organic solvent as ethylene glycol, and propylene glycol can be utilized. Also if necessary, it is possible to mix a salt or an alkali in the solution, in order to adjust the PH of the solution.

A propylene glycol will be added to 3% by weight solution of tartaric acid, in the ratio of 9 parts of propylene glycol per 1 part of the solution, to prepare AGW electrolytic solution, in which this substrate will be immersed. An aluminum gate electrode will be connected to an anode of electric source, and D.C. power will be applied using a platinum as a cathode.

The anodic oxidation condition is as follows. At first, under constant current mode, 2.5 mA/cm$^2$ of an electric current density will be passed for 30 min. After that, under constant voltage mode, it will be treated for 5 min. to form aluminum oxide in 2500 Å thick around the side of gate electrode. The insulation properties of the aluminum oxide film will be measured, using the aluminum oxide sample obtained by the same oxidation treatment with the above forming. It is an aluminum oxide film having $10^9$ Ωm of resistivity and $2\times10^5$ V/cm of dielectric strength.

Also in the observation of the sample surface with a scanning electron microscope, the unevenness of the surface can be come into view, by enlarging the surface to about 8000 magnifications. But the very small hole can not be noticed, which is a certain evidence of a good insulation film.

Next, on this upper surface, a silicon oxide film 12 will be formed by means of plasma-CVD method followed by an anisotropic etching treatment in the vertical direction to the substrate to remain the silicon oxide 13 at the side position of convex part which is composed of the insulation film 11, the gate electrode 8, and the anodic oxidation film 10, as illustrated in FIG. 3 (D).

This silicon oxide film 12 will be formed at such low temperature as 200° C., which is lower than the usual temperature of forming-atmosphere, so that the etching speed will be higher than that of insulation film 11. As this film, an organic resin film and the like can be used in addition to the silicon oxide film. Then, the under part of semiconductor layer 2 will be etched to remove it by self-alignment method, using the mask of the remained silicon oxide 13, and the convex part composed of the insulation film 11, the gate electrode 8, and the anodic oxidation film 10. This treating state is shown in FIG. 3 (E), and the upper surface state is shown in FIG. 4 (A) Also the cross-sectional view taken along line A—A' of FIG. 4 is shown in FIG. 3.

Following this state, the silicon oxide 13 and the silicon oxide of a portion of the gate insulating film 6 will be removed by etching with the convex part as a mask to expose portions of the semiconductor layer 2 outside the side of the gate electrode as shown in FIG. 3 (F) and FIG. 4 (B). The impurity will be doped in the exposed portions to be source and drain regions. As indicated in FIG. 3 (F), phosphorus ion will be treated to implant from the upper surface of substrate, using the mask of the anodic oxidation film 10 of the gate. In this way, the source and drain regions 3 will be formed. After that, the source and drain regions will be activated, treating with a laser annealing to irradiate a laser beam to it. As the activation treatment, heat-annealing and so on can be used, besides the above laser annealing.

Next, an aluminum to be source and drain electrodes will be formed on this upper surface. Then, the aluminum will be etched to effect the prescribed patterning by using the second mask ②, and will be split into both the source and drain electrodes, the state of which is indicated in FIG. 4 (C). Lastly, the semiconductor layer 2 protruded around will be etched to remove it, using both the source and drain electrodes 7 and the convex part as a mask. Thus, the preparation of TFT will be completed, as shown in FIG. 3(G) and FIG. 4(D).

The preparation process of TFT described in the above is just one example, and the present invention is not limited to the above process. For example, although doping process of impurities to the source and drain regions is carried out after patterning the semiconductor layer 2 in the above description, as shown in FIG. 3 (F), it is possible to implant impurity ions into source and drain regions in the condition shown in FIG. 3 (B) with the insulation film 11 as a mask.

As the other example of preparing TFT shown in FIG. 1, a schematic diagram of the preparing process is indicated in FIG. 5. In the preparing process of TFT in FIG.5 a conventional technology is applied without employing such specific technology as the anisotropic etching adopted in the preparing process of FIG. 3.

In the same way with the case of FIG. 3, after a silicon semiconductor film is formed on the whole area of an insulation substrate 1, the semiconductor island 2 corresponding to the part of TFT element including the source and drain regions and the channel region thereof will be formed, by patterning the semiconductor film using a first mask. The plan view at this time is shown in FIG. 6 (A), and the cross-sectional view of around the source, drain, and gate of the TFT is shown in FIG. 5 (A).

Next, the gate insulation film 6, the aluminum 8 of gate electrode, and the insulation film 11 will be sequentially formed as shown in FIG. 5 (B), covering this upper surface. Then, these films will be etched to complete the convex part as shown in FIG. 5 (C), by using a second mask, and the semiconductor film 2 will be exposed from the convex part, so that the gate part will be formed at the prescribed position of the semiconductor island 2. A plan view at this time is shown in FIG. 6(B).

Under this situation, the anodic oxidation film 10 will be formed nearby the side of the gate electrode 8 in the same process of FIG. 3(B), resulting in the state of FIG. 5 (C). Next to this, the source and drain regions 3 will be formed by doping impurity ion for source and drain in the exposed semiconductor island 2, as shown in FIG. 5 (D). The ion doping will be conducted by the following way. The doping direction is slantweise or the diffusional treatment of impurity will be effected, and the boundary between the source or drain and the channel region is located around the end of gate electrode 8, i.e., to the inner side of the end of anodic oxidation film 10, thereby making it possible to keep a sufficient insulating properties with only the anodic oxidation film 10, without any short circuit, even if the source and drain electrodes are provided nearby contact between the anodic oxidation film and the gate insulation film 6. Next, a metal film will be formed, covering all of these surfaces. After that, the metal film will be patterned using a third mask, enabling the source and drain electrodes 7 to be split and to be extended up to the insulation film 11 and to obtain the structure as shown in FIG. 5 (E). Then, an etching will be effected using the source and drain electrodes 7 as masks, to get rid of the semiconductor film protruded from the electrodes 7, and thus the TFT of the present invention will be obtained, as shown in FIG. 6 (C).

In comparison with the preparing method shown in FIG. 3, if the semiconductor layer is patterned into an island including a TFT region therein by using a photomask newly before the forming process of gate electrode after forming of the semiconductor layer 2, the substrate or the insulation film on the substrate will only exist under the lead wiring part of gate electrode, without the existence of semiconductor layer 2 as shown in FIG. 6. At this part, it is possible that the condenser will not constitute. This constitution makes it possible to prepare the TFT which is capable of higher response, using three sheets of mask. This situation is illustrated in FIG. 6 (D) which is a fragmentary cross-sectional view of taken along line B—B' of FIG. 6 (c).

As evident in the above, it is possible to prepare TFT using only two or three sheets of mask, in accordance with the present invention. It is also possible to prepare the complementary TFTs, adding more one or two sheets of mask. Further, the connection to the gate electrode from outside can be effected, by forming an anodic oxidation film so that a part of gate electrode is not contacted with an electrolytic solution for the anodic oxidation, in the treatment of anodic oxidation, or by selectively etching the source and drain electrodes or the anodic oxidation film to remove the anodic oxidation film exposed to the outside, after etching the last unnecessary semiconductor layer. Of course, it can be connected by making a hole suitable for the contact in a special place, using new other mask.

BRIEF DESCRIPTION OF THE DRAWING

The objects, features, and advantages of the present invention will become more apparent from the following description of the preferred embodiments taken in conjunction with the accompanying drawings, in which.

DETAILED DESCRIPTION OF THE EMBODIMENTS

The present invention will be explained in more detail by reference to the following Examples, in connection with the drawings.

Example 1

Figure 1:
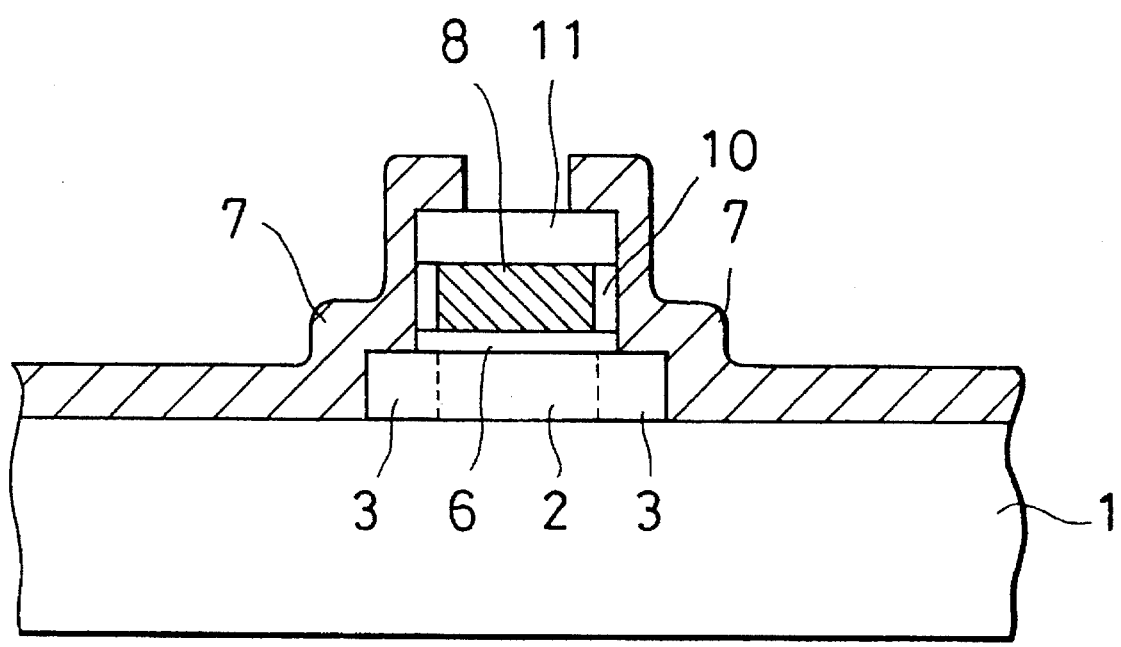
FIG. 1 is a diagram showing one example of the element structure of TFT in accordance with the present invention.
Figure 2:
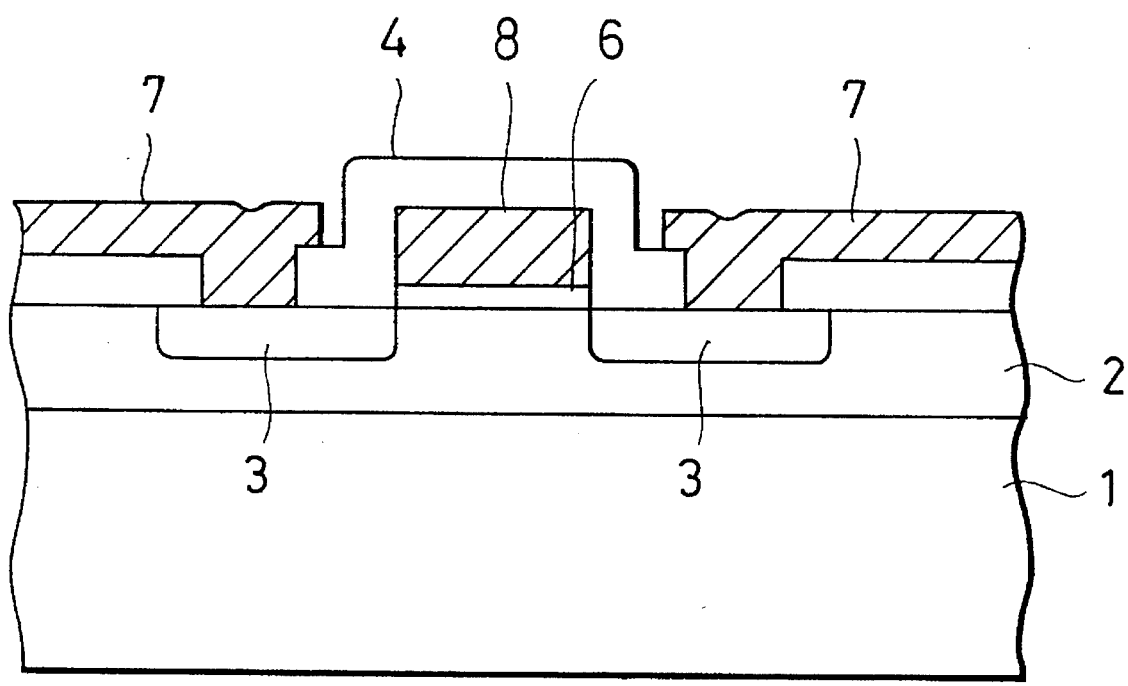
FIG. 2 is a diagram showing the usual element structure of TFT.
Figure 3A:
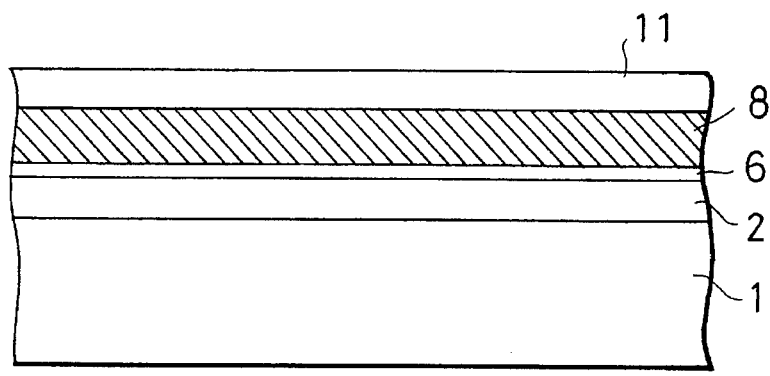
FIGS. 3(A)–3(G) Are a schematic cross-sectional view of the preparing process of TFT in accordance with the present invention.
Figure 3B:
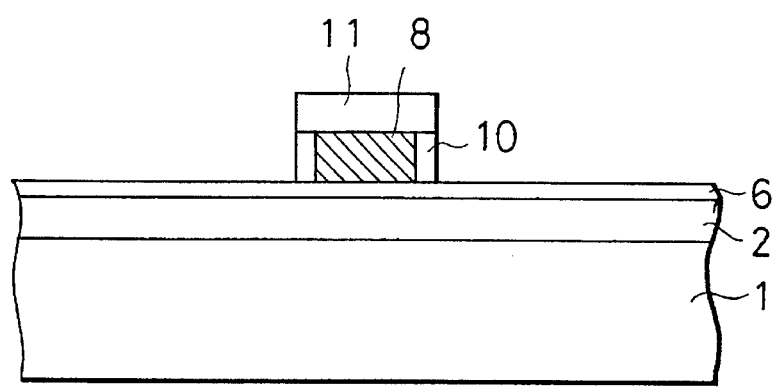
Figure 3C:
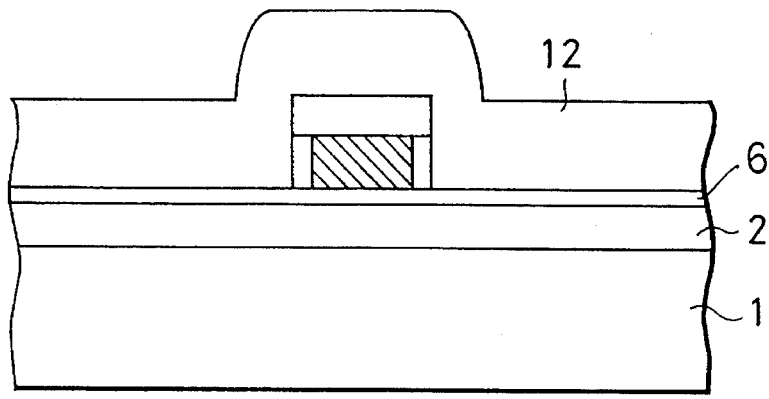
Figure 3D:
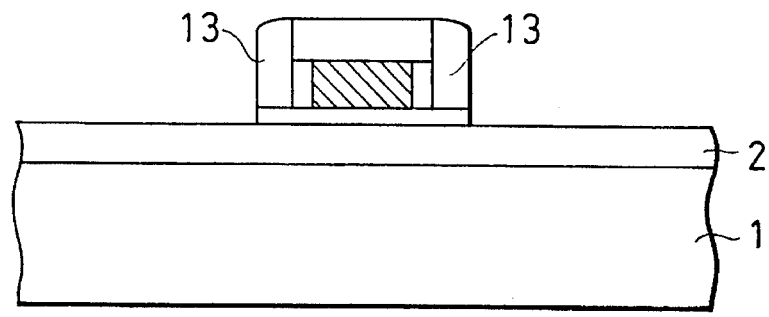
Figure 3E:
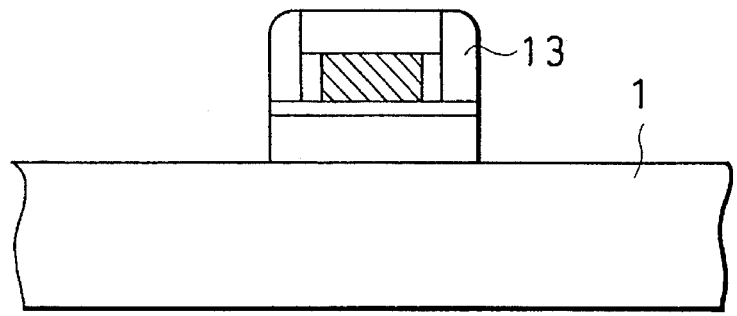
Figure 3F:
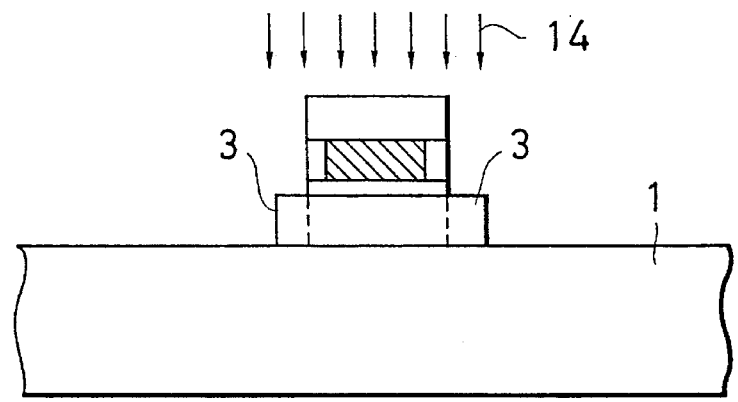
Figure 3G:
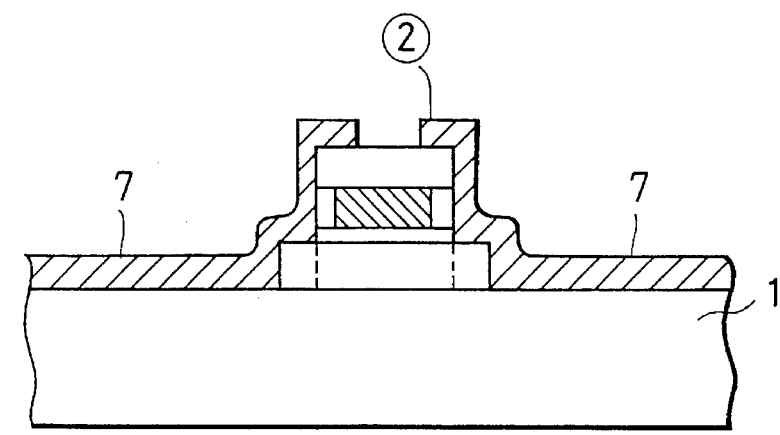
Figure 4A:
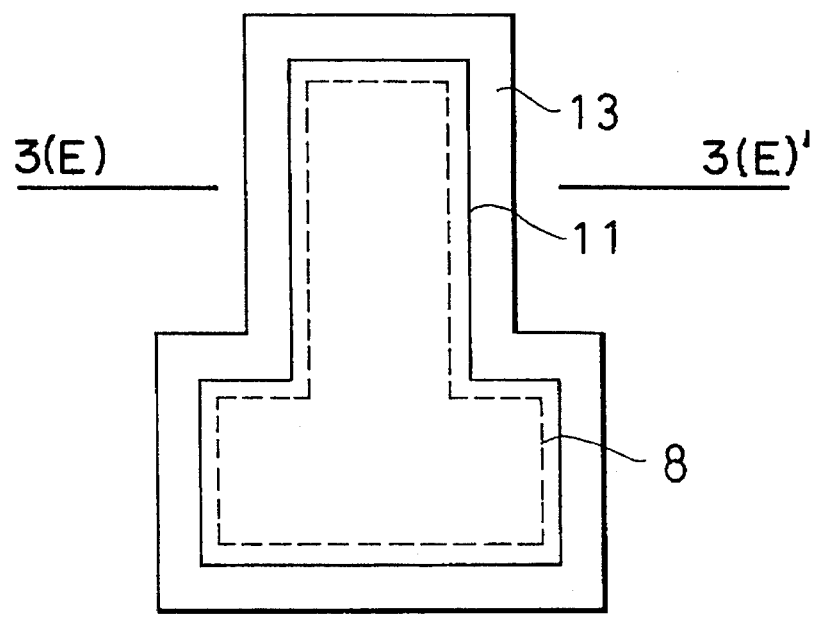
FIGS. 4(A)–4(D) Are a plan view of the preparing process of TFT in accordance with the present invention.
Figure 4B:
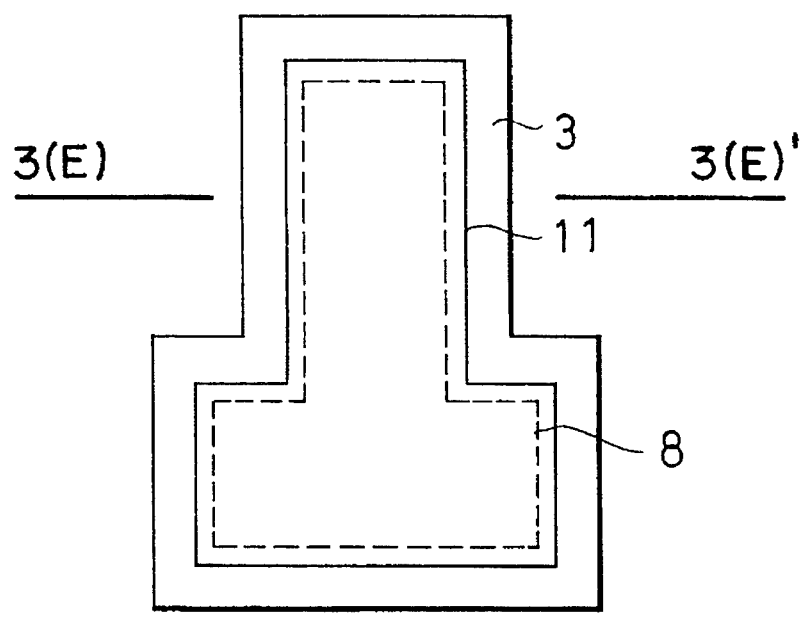
Figure 4C:
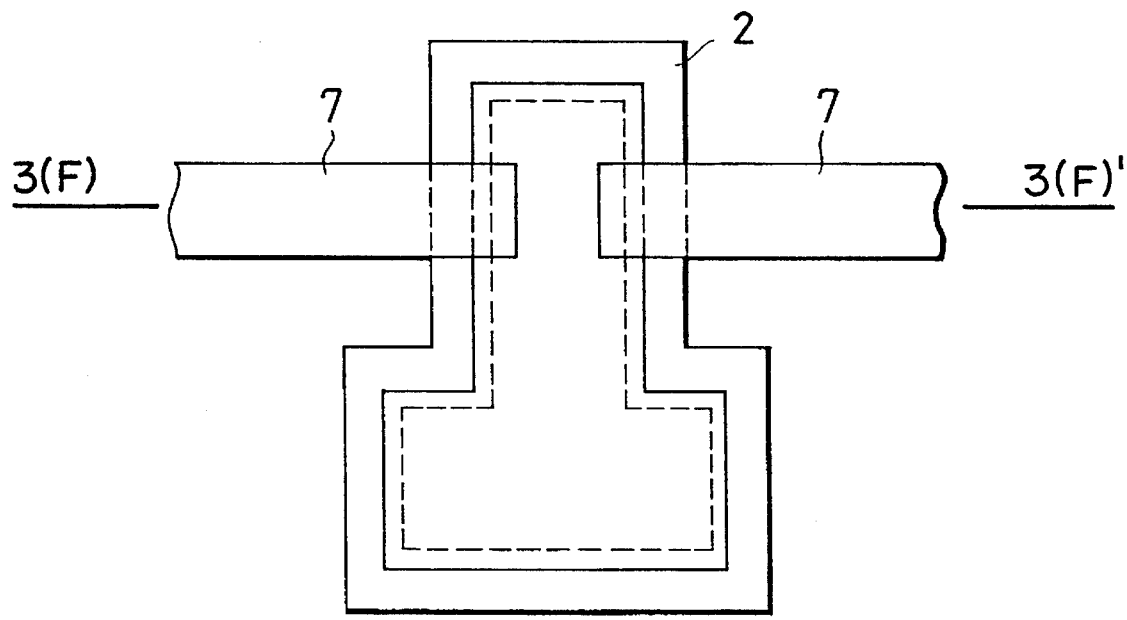
Figure 4D:
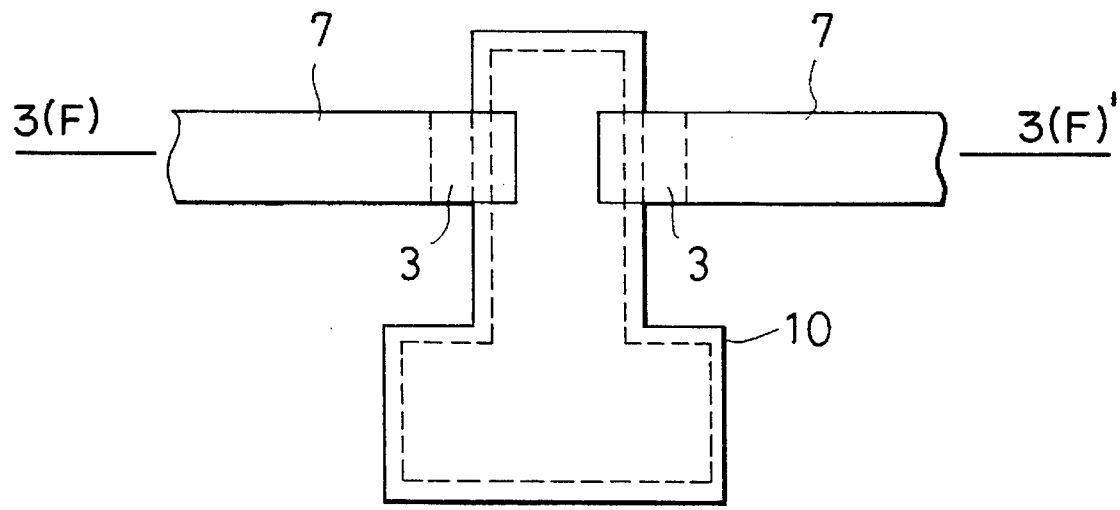
Figure 5A:
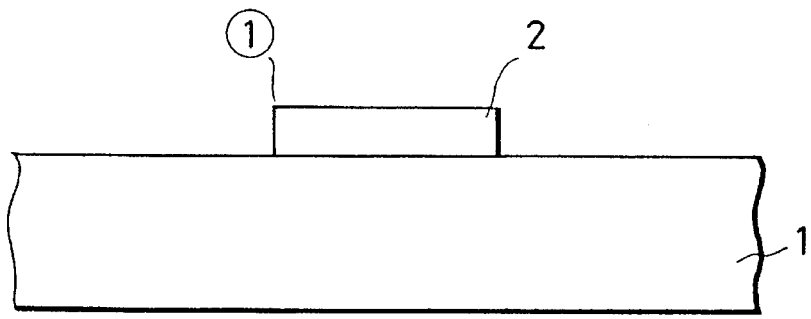
FIGS. 5(A)–5(E) Are a schematic cross-sectional view of an another preparing process of TFT in accordance with the present invention.
Figure 5B:
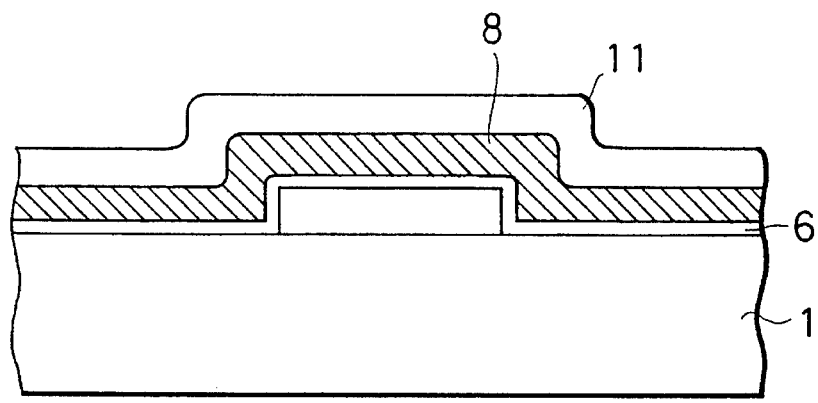
Figure 5C:
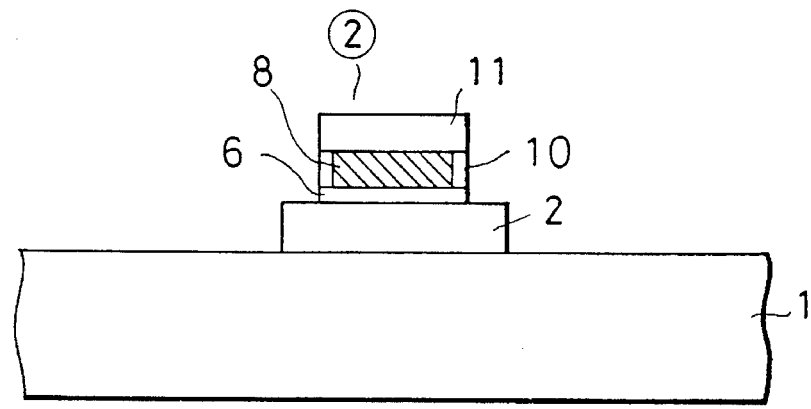
Figure 5D:
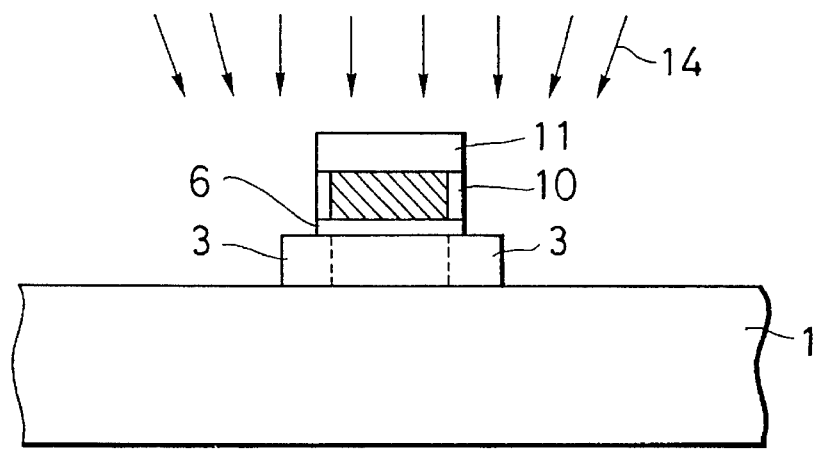
Figure 5E:
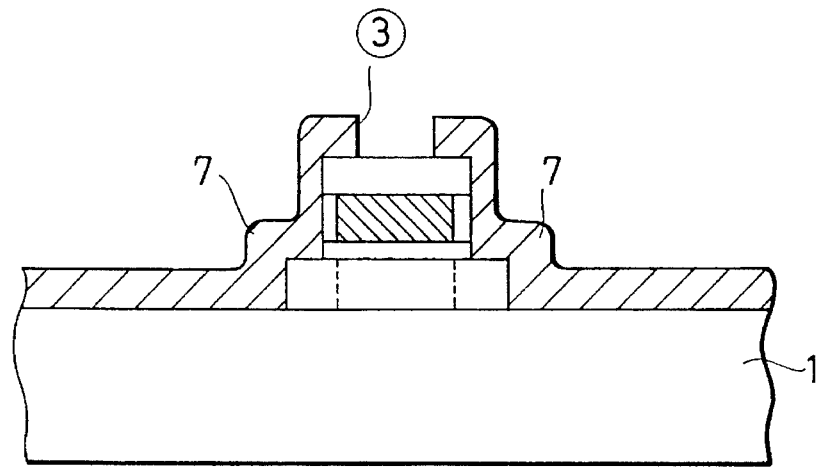
Figure 6A:
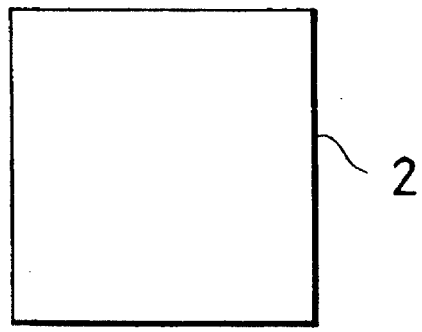
FIGS. 6(A)–6(D) Are is a plan view of an another preparing process of TFT in accordance with the present invention.
Figure 6B:
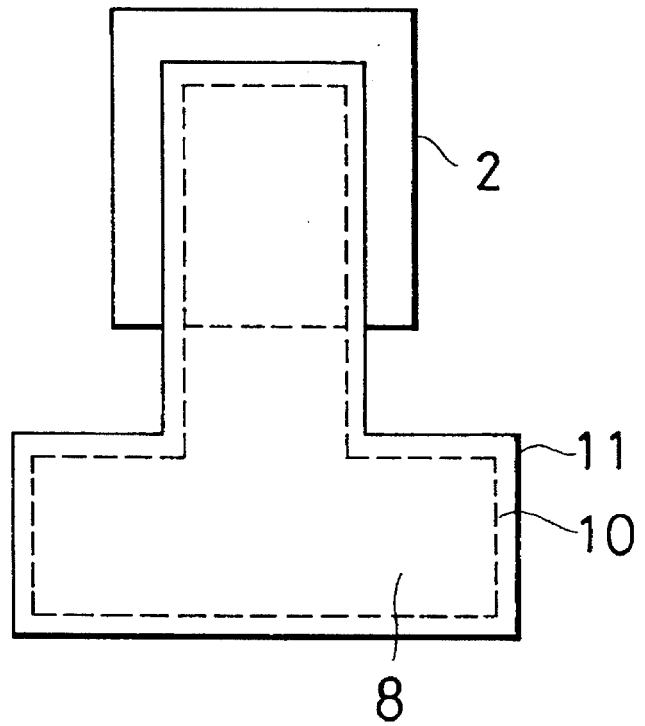
Figure 6C:
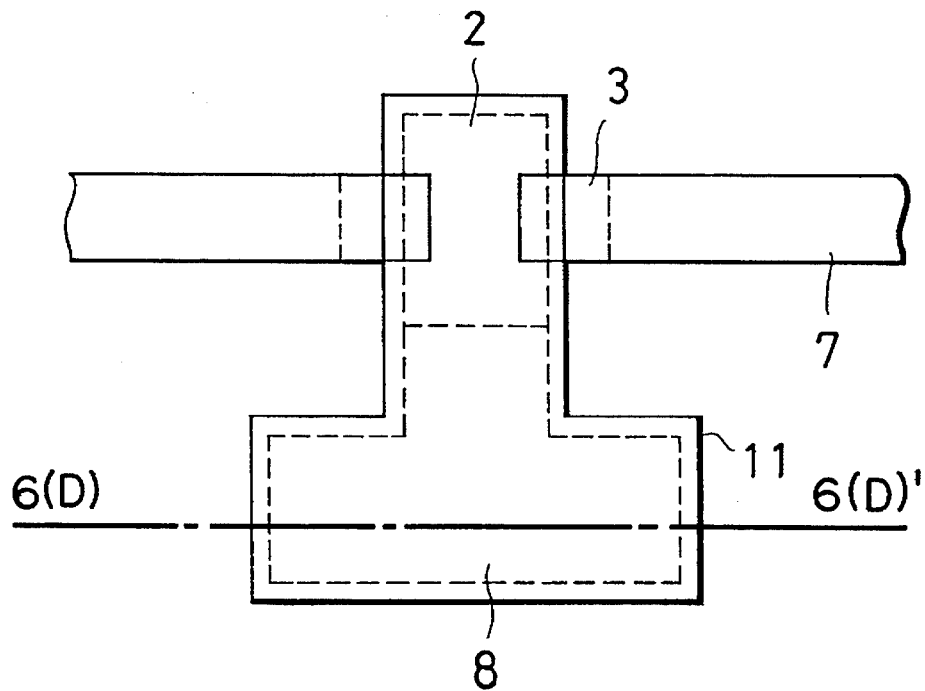
Figure 6D:
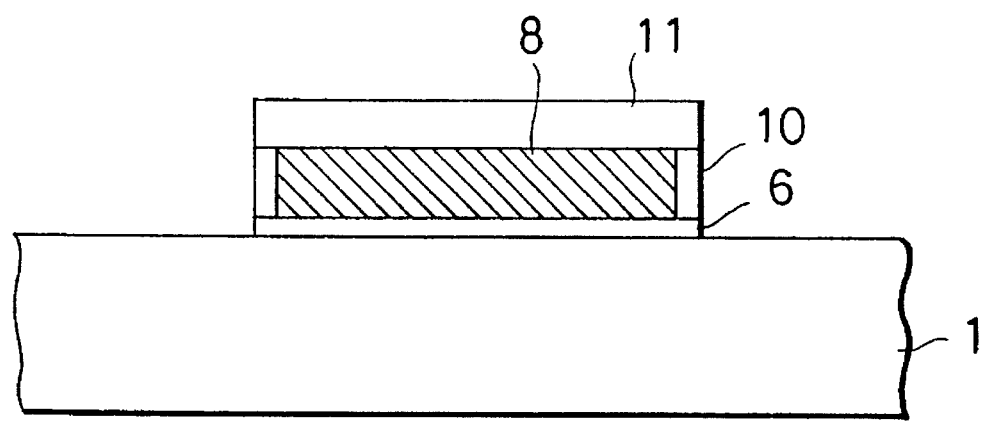
Figure 7:
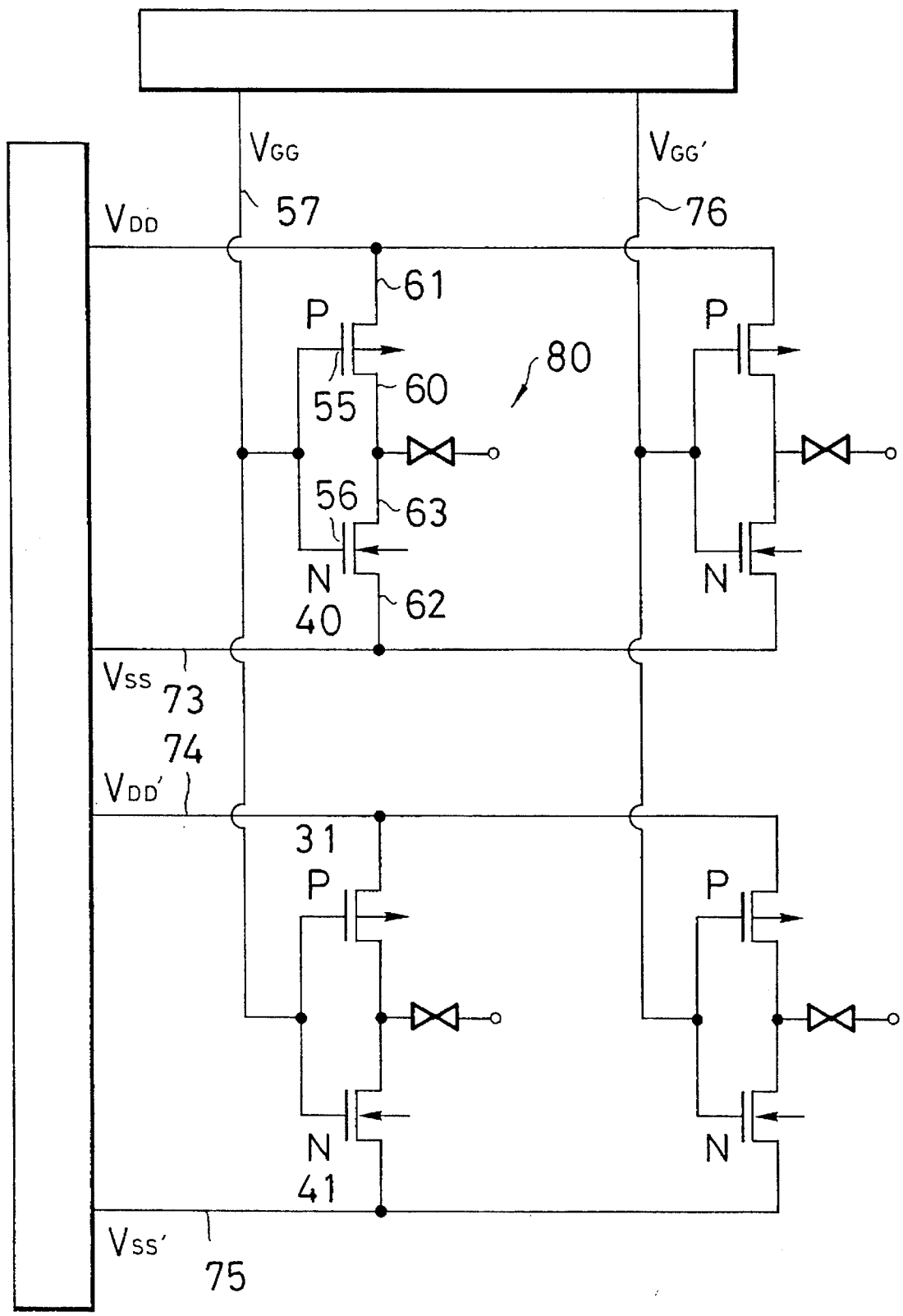
FIG. 7 is a schematic diagram showing the circuit, in case where complementary TFTs of the present invention are applied to a liquid crystal electro-optical device.
Figure 8A:
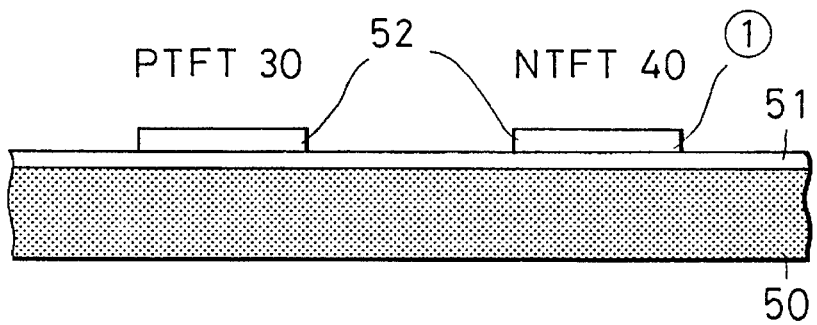
FIGS. 8(A)–8(I) Are a schematic cross-sectional view of the preparing process of complementary TFTs of the present invention, in case where the TFTs are applied to a liquid crystal electro-optical device.
Figure 8B:
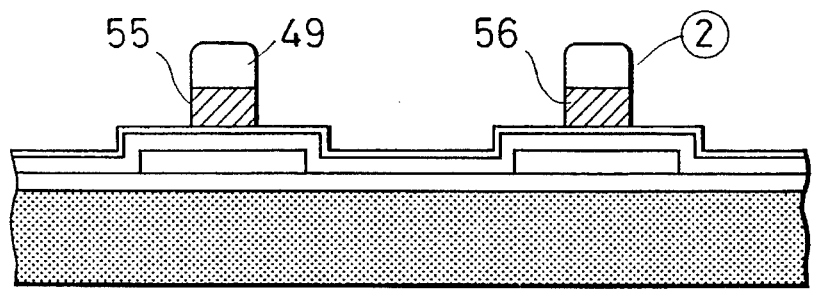
Figure 8C:
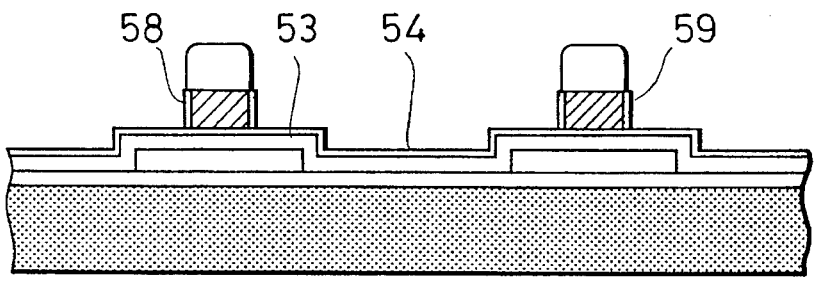
Figure 8D:
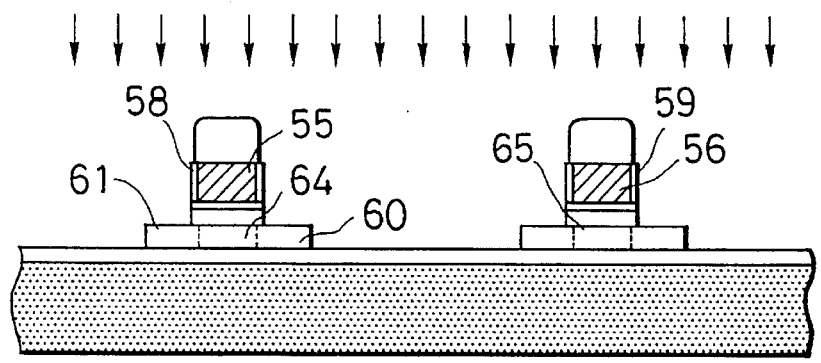
Figure 8E:
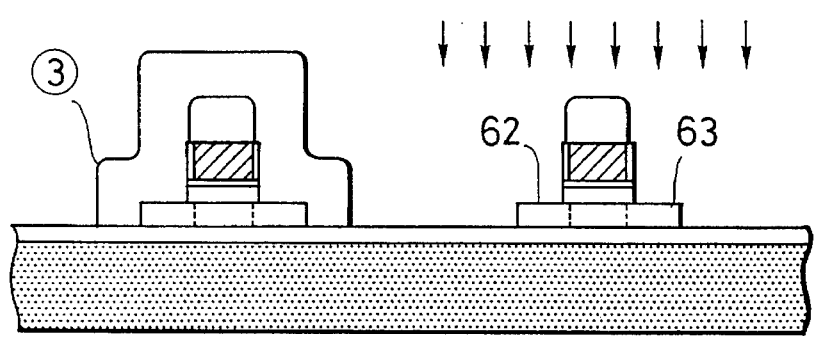
Figure 8F:
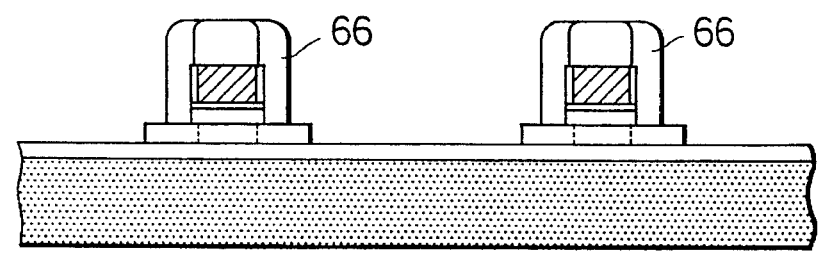
Figure 8G:
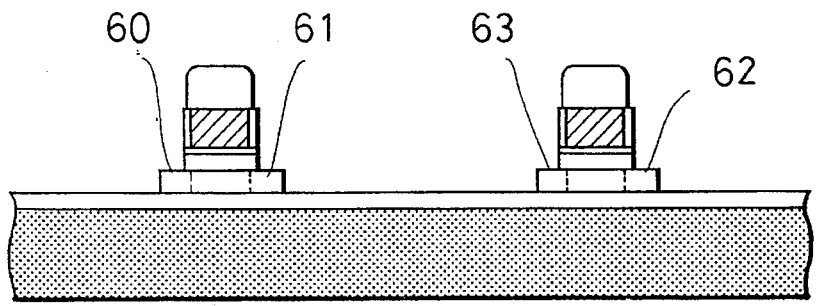
Figure 8H:
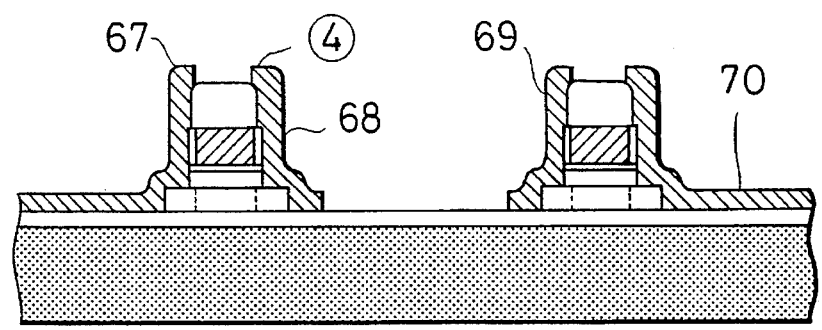
Figure 8I:
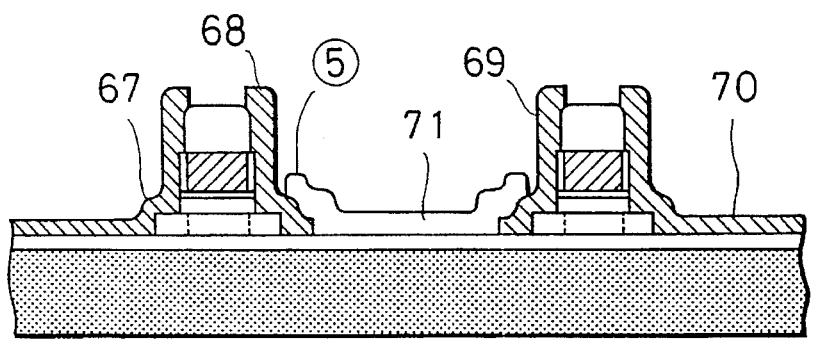
Figure 9A:
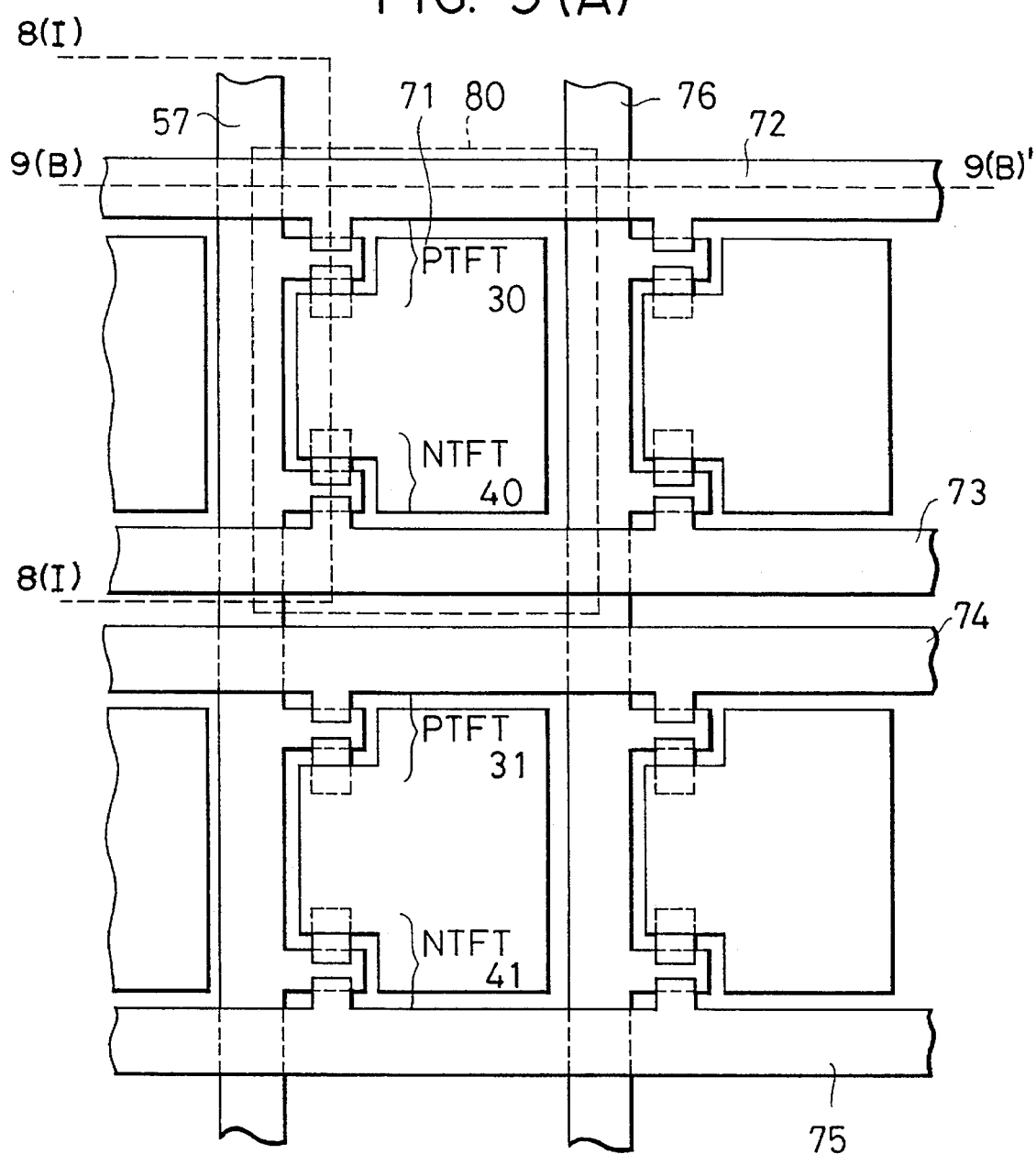
FIGS. 9(A)–9(B) Are a schematic diagram showing the arrangement state of complementary TFTs of the present invention on a substrate, in case where the TFTs are applied to a liquid crystal electro-optical device.
Figure 9B:
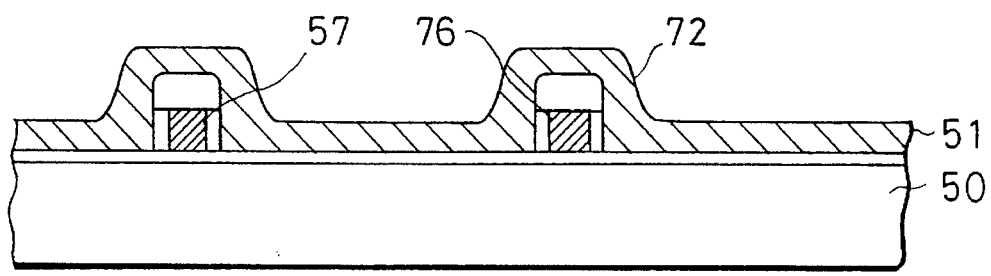

In this Example, it is described the case where TFT of the present invention is applied to the active matrix type liquid crystal electro-optical device having a circuit structure shown in FIG. 7. As clear in the FIG. 7, the active circuit element of this Example is a complementary type structure, and PTFT and NTFT are prepared to a picture element electrode. The actual arrangement structure of electrode etc. corresponding to this circuit structure is indicated in FIG. 9. The only part corresponding to 2×2 is described therein, to explain it in short.

Firstly, a preparing method of the substrate for a liquid crystal electro-optical device to be used in this Example will be explained, by referring to FIG. 8. In FIG. 8 (A), a silicon oxide film as the blocking layer 51, was formed in 1000 to 3000 Å thick on the glass 50, which was capable of proofing against heat-treatment of 700° C. or less, e.g., about 600° C., and such not expensive as quartz glass was used, by using the magnetron RF (High Frequency) sputtering method. The followings are the process conditions. The atmosphere; 100% by weight oxygen, The film-forming temperature; 15° C., The output power; 400 to 800 W, The pressure; 0.5 Pa, The film-forming speed using a quartz or single crystal silicon as a target was 30 to 100 Å/min.

On this film, silicon film 52, which would become a source, a drain, and a channel forming regions later, was formed by using LPCVD (Low Pressure Chemical Vapor Deposition) method, Sputtering method, or Plasma CVD method. In the LPCVD method, the film-forming was carried out by supplying the CVD device with a disilane ($Si_2H_6$) or a trisilane ($Si_3H_8$), at the temperature of 450° to 550° C., e.g., 530° C. which was by 100° to 200° C. lower than the crystallization temperature. 30 to 300 Pa of the pressure in a reaction furnace and 50 to 250 Å/min. of the film-forming speed were employed. It is possible to add a boron to the forming film, at a concentration of $1\times10^{15}$ to $1\times10^{18}$ cm$^{-3}$ using a diborane, in order to control threshold voltages (Vth) of PTFT and NTFT approximately at the same value.

In the Sputtering method, it was carried out in the atmosphere where the back pressure was $1\times10^{-5}$ Pa or less, before the sputtering, using a single crystal silicon as a target, and hydrogen was mixed in argon in the ratio of 20 to 80% by weight. For example, argon 20 % and hydrogen 80% was used. Also 150° C. of the film-forming temperature, 13.56 MHz of the frequency, 400 to 800 W of the sputtering output, and 0.5 Pa of the pressure were employed.

In the case of silicon film-forming using a Plasma CVD method, for example 300° C. of temperature and a monosilane ($SiH_4$) or a disilane ($Si_2H_6$) were employed. These were introduced into the CVD device, and 13.56 MHz of high frequency wave electric power was applied to form a film.

It is preferable that the films formed by these methods contain $5\times10^{21}$cm$^{-3}$ or less of oxygen. If the oxygen concentration is high, it is difficult to effect a crystallization, and then it is required to raise the heatannealing temperature or to lengthen the heat-annealing time. To the contrary, if it is low, a leak current of the off state will increase by a backlight. For that reason, the oxygen concentration was in the range of $4\times10^{19}$ to $4\times10^{21}$ cm$^{-3}$. It was $4\times10^{20}$ cm$^{-3}$ for hydrogen concentration, which was 1 atom % as compared with $4\times10^{22}$ cm$^{-3}$ for silicon concentration.

To promote the more crystallization of source and drain, it is possible that the oxygen concentration is $7\times10^{19}$cm$^{-3}$ or less, preferably $1\times10^{19}$cm$^{-3}$ or less and oxygen is added to only the channel-forming region of TFT constituting a pixel, in the range of $5\times10^{20}$ to $5\times10^{21}$ cm$^{-3}$ by ion implantation method. At this time, it is effective for the high frequency operation to have a larger carrier mobility, by causing the oxygen concentration to be low, since a light is not radiated to TFT which constitutes the peripheral circuit.

An amorphous state silicon film was formed in 500 to 3000 Å thick, e.g., in 1500 Å thick, by the above mentioned method. After that, it was kept in the non oxide atmosphere for 12 to 70 hours at 450° to 700° C., e.g., in the hydrogen atmosphere and at 600° C. At this time, the whole of the silicon film can be uniformly annealed since an amorphous silicon oxide film was formed on the substrate surface under the silicon film and there exists no particular core in this heat treatment. By the annealing, the silicon film was changed from its amorphous structure to high order state, and a part of it showed a crystalline state. The obtained hole mobility ($\mu h$) was 10 to 200 cm$^2$/V.Sec, and the obtained electron mobility ($\mu e$) was 15 to 300 cm$^2$/V.Sec.

In FIG. 8 (A), the silicon film was photo-etched with the first mask ①. The region 30 for PTFT (Channel width: 20 µm) was prepared at the left side of FIG. 8 and the region 40 for NTFT was prepared at the right side of FIG. 8. On this, the silicon oxide film as the gate insulation film 53 was formed in 500 to 2000 Å thick, e.g., in 700 Å thick. This was done by the same condition with that of the silicon oxide film 51 as the blocking layer. It is possible to add a little amount of fluorine in the film being formed, so as to fix sodium ion. Also in this Example, the silicon nitride film 54 was formed on this silicon oxide film, in 50 to 200 Å thick, e.g., in 100 Å thick, as a blocking layer which has a function to control a reaction between the gate insulation film and the gate electrode formed thereon.

After that, as a material for the gate electrode, aluminum was formed on this upper side, in 3000 Å to 1.5 µm thick, e.g., in 1 µm thick, by conventional sputtering method. As this gate electrode material, besides aluminum, molybdenum (Mo), tungsten (W), titanium (Ti), tantalum (Ta), alloy composed of these materials mixed with silicon, and lamination wiring comprising a metallic film and a silicon film etc. can be used.

Since a metallic material is used for a gate electrode in this Example, a gate delay (the delay of electric pulse and the distortion of waveform which spread in the gate wiring) caused by a large substrate area and a fine structure can be reduced by a low resistance of a metallic material particularly aluminum, thus enabling increase of a substrate area.

Further, on this gate electrode material, a silicon oxide film was formed in 3000 Å to 1 µm thick, here in 8000 Å thick, as the insulation film 49 by sputtering method. Then, the insulation film 49 and the gate electrode material were patterned by the second photomask ② to form the gate electrode 55 for PTFT and the gate electrode 58 for NTFT as shown in FIG. 8 (B). Each of the gate electrodes is connected to the same gate wiring 57.

Next, this substrate was immersed in AGW electrolytic solution, which is 3% by weight tartaric acid aqueous solution mixed with propylene glycol in the ratio of 9 parts based on 1 part of the tartaric acid solution. Then, D.C. electric power was applied between the aluminum gate electrode and the platinum cathode, the aluminum gate electrode being connected to an anode of electric power source. Each gate electrode was connected to each gate wiring, but all the gate wirings were put into a connecting terminal around the end of substrate. Under these conditions, the anodic oxidation was effected to form the anodic oxidation films 58 and 59, neighboring the side of gate electrode as shown in FIG. 8 (C).

The condition of the anodic oxidation is described below. At first, under constant current mode, the electric current was applied as 4 mA/cm$^2$ of electric current density for 20 min. Then, under constant voltage mode, it was treated for 15 min. to form an aluminum oxide in 2500 Å thick, nearby the side of gate electrode. It is preferable to form this anodic oxidation film as thick as possible. It, therefore, was formed thickly so far as condition permits.

Next, as shown in FIG. 8 (D), the nitride film 54 and the silicon oxide film 53 on the semiconductor were etched to remove them. After that, 1 to $5\times10^{15}$ cm$^{-2}$ dose of boron as an impurity for PTFT was added to all the surface of substrate, by an ion implantation method. The source 60 and the drain 61 of PTFT were formed with their doping concentration of about $10^{19}$ cm$^{-3}$. In this Example, the ion doping was conducted after the insulation film on surface was removed. But it is possible to conduct a doping through the insulation films 53 and 54, by changing the condition of ion implantation.

Next, the photoresist 61 was formed using the third photomaske ③ as indicated in FIG. 8 (E). Then, after PTFT region was covered, 1 to $5\times10^{15}$ cm$^2$ dose of phosphorus as an impurity was added to the source 62 and the drain 63 for NTFT by an ion implantation method, resulting in that the doping concentration reached to about $10^{20}$ cm$^{-3}$. The implantation was carried out in a slanting direction to the substrate in the above doping processes so that impurities reached areas under the anodic oxidation film and the end parts of the source and drain regions were aligned with the end parts of the gate electrode. In this way, it was not needed to form an insulation film newly, since the anode oxidation had an enough insulating action to the electrode wiring to be formed at the later process.

Next, the heat-annealing was effected again at 600° C. for 10 to 50 hours, to activate the impurity regions. The source 60 and the drain 61 of PTFT, and the source 62 and drain 63 of NTFT were formed by activating the impurity to produce P+ and N+. Also under the gate electrodes 55 and 56, the channel forming regions 64 and 65 were formed. In this Example, the annealing by heat was carried out as the activation treatment. But besides this, it can be adopted that a laser light is radiated to the source and drain regions to activate them. In this case, it is not necessary to consider the diffusion of metallic material which is used in a gate electrode, and it is also possible to omit the silicon nitride film 54, which was employed in this Example, usable for the blocking action, since the activation treatment is effected instantaneously.

Next, on this upper face, an insulation film was formed as a silicon oxide film, by the aforementioned sputtering method. It is preferable that the thickness of this film is as thick as possible, e.g., 0.5 to 2.0 μm. In this Example, the film was formed in 1.2 μm thick. Then, the remaining region 66 was formed around the side wall of the convex part composed of the insulation film, the gate electrode, and the anodic oxidation film, by anisotropic etching treatment being effected from this upper face. This state is shown in FIG. 8 (F).

Next, with this convex part and remaining region 66 as a mask, an unnecessary part of the semiconductor film 52 was etched to remove it. Then, the remaining region 66 existing around the side of the convex part was removed, revealing the semiconductor film 52 to become source and drain regions of each TFT, at the outside of the convex part. This state is indicated in FIG. 8 (G).

Further, on the whole of these, an aluminum was formed by sputtering method, and the leads 67 and 68 and the contact parts 69 and 70 were formed by patterning using the fourth mask 4. After that, the semiconductor film protruded from the electrodes 67, 68, 69, and 70, the anodic oxidation films 58 and 59, and the insulation films 49 provided on the gate electrodes 55 and 56 were removed by etching, thereby completely separating the circuit elements and completing the TFT. By such preparing method, the complementary TFTs were obtained with four sheets of mask. This situation is shown in FIG. 8 (H).

As to this TFT, the side circumference of the gate electrode is wrapped up with an anodic oxidation film, and only the electrode connecting parts of the source and drain regions are protruded from the gate electrode part, but all the other parts are situated under the gate electrode. Also, source and drain electrodes are in contact with the two places of the upper and side faces of the source and drain regions, respectively, and it is ensured that sufficient ohmic connection is made between the source electrode and the source region and between the drain electrode and the drain region.

By this preparing method, C/TFT can be obtained without applying the temperature of more than 700° C. in all the processes, though it is obtained by a self-alignment method. For that reason, it is not necessary to use such expensive substrate as quartz, and it is most suitable process for the preparation of a big picture type liquid crystal electro-optical device, according to the present invention.

In this Example, the heat-annealing was conducted two times as shown in FIG. 8 (A) and FIG. 8 (E). But the annealing in FIG. 8 (A) can be omitted according to the demanding properties, and it is possible to shorten the preparation time, by omitting the heat-annealing of FIG. 8(A) and conducting heat-annealing of FIG. 8(E) serving as both the annealings. Also, in this Example, aluminum was employed as the gate electrode, but a good interface characteristics could be realized without any reaction of the aluminum with the gate insulation film being laid at the under part of it, since the silicon nitride film 54 was prepared therebetween.

Next, ITO (Indium Tin Oxide film) was formed by sputtering method to connect a transparent electrode of a picture element (pixel) of a liquid crystal device with the output terminals of two TFTs in complementary structure. This ITO was etched by the fifth mask ⑤ (to form a picture element electrode 71. The film of ITO was formed at room temperature to 150° C., and was annealed in the oxygen or the atmosphere at 200° to 400° C. Thus, PTFT 30, NTFT 40, and the electrode of transparent conductive film 71 were prepared on the same glass substrate. The electric characteristics of the obtained TFT follows. In case of PTFT, the mobility was 20 (cm$^2$/Vs) and Vth was −5.9 (V), and in case of NTFT, the mobility was 40 (cm$^2$/Vs) and Vth was 5.0 (V).

FIG. 9 shows the arrangement of electrode etc. of this liquid crystal electro-optical device. The C—C' line sectional view of FIG. 9 (A) corresponds to the cross-sectional view of the preparing process shown in FIG. 8. PTFT 30 is prepared at the cross over part of the first signal line 72 and the third signal line 57. Also, a PTFT for another picture element was prepared at the cross over part of the first signal line 72 and the third signal line 76 of the right next line. On the other hand, NTFT is prepared at the cross over part of the second signal line 75 and the third signal line 57. Also, a PTFT for another picture element is prepared, at the cross over part of the other first signal line 74 and the third signal line 57.

It was made to have a matrix constitution using such C/TFT. PTFT 30 is connected to the first signal line 72, at the electrode of the drain 61. The gate 55 is connected to the signal line 57. The output terminal of the source 60 is connected to the electrode of picture element 71, through a contact.

On the other hand, NTFT 40 is connected to the second signal line 73, at the electrode of source 62. The gate 56 is connected to the signal line 57, and the output of drain 63 is connected to the picture element electrode 71, like PTFT, through a contact. Also, other C/TFTs which are provided adjacent to the picture element 80 and connected to the same third signal line 57 comprises a PTFT 31 connected to a first signal line 74, and an NTFT 41 connected to a second signal line 75.

Thus, one pixel 80 comprising the C/TFTs and the picture element electrode 71 formed from the transparent conductive film was formed between a pair of signal lines 72 and 73. By repeating such structure on both sides or on the upper and lower sides, it is possible to obtain a liquid crystal electro-optical device having a lot of picture elements, that is 2×2 matrix can be enlarged to 640×480, 1280×960 matrix. Here, it is just for the explanation that the impurity region of TFT is referred to as the source, drain. But there is a different case from the referenced function in an actual driving.

In this Example, the separation of each TFT circuit element is effected by etching the semiconductor film 52 into an island shape to remove it, using the first photomask. Accordingly, under gate wiring excepting the TFT region, there exists no semiconductor film, but exists a substrate or an insulation film on the substrate. At this part, there occurs no capacity forming of the gate input side, thereby making it possible to respond with a high speed.

Further, the cross-sectional view corresponding to the fragmentary cross line D—D' of FIG. 9 (A) is shown in FIG. 9 (B). According to the present invention like this, the insulation film 49 is certainly prepared on the wiring of gate electrode, at the cross over part of the gate electrode wirings 57 and 76 and the wiring 72. It, therefore, has become possible to prevent the wiring at this part from its capacity generation, and to prepare the integrated circuit of TFT having a multi-wiring structure with only four sheets of mask.

Using the substrate with such active circuit element as prepared in the above, a liquid crystal electro-optical device can be obtained. Firstly, on the substrate, the resin, which is prepared by dispersing 50% by weight of nematic liquid crystal in an epoxy modified acrylic resin having an ultraviolet ray hardening properties, was formed using a screen method. The employed screen mesh density in this case was 125 mesh per 1 inch. The emulsion was in 15 µm thick, and the sequeegee pressure was 1.5 kg/cm$^2$.

Next, after leveling for 10 min. the resin was hardened to form an electro-optical layer in 12 µm thick, supplying 1000 mJ energy with a high pressure mercury lamp having an emission wave length ranging around the center of 236 nm. After that, Mo (Molybdenum) film in 2500 Å thick was formed to prepare the second electrode, using D.C. sputtering method.

Then, a black color epoxy resin was printed using a screen method, and a protective film in 50 µm thick was formed, by effecting the temporary burning at 50° C. for 30 min. and then the main burning at 180° C. for 30 min. A driving IC having a TAB shape was connected to the lead on a substrate, and a reflection type liquid crystal display device composed of only one substrate was completed.

In this Example, each pair of TFTs of the complementary type constitution was prepared in each picture element, as an active circuit element. But the present invention is not limited to this constitution, and it is possible to prepare plural pairs of TFTs of the complementary type constitution. Further, it is possible to prepare plural pairs of TFTs of the complementary type constitution in the picture element electrode which is divided into plural pieces.

As described above, the liquid crystal electro-optical device comprising the active circuit element for driving the dispersion type liquid crystal was completed. The diffusion type liquid crystal according to this Example needs only one sheet of substrate, so that it is possible to provide a light and thin liquid crystal electro-optical device at a low price. Also it is possible to provide a very bright liquid crystal electro-optical device, since a polarizing plate is not used and also an orientation control film is not needed. Moreover, the present invention can be applicable to one of the substrates for a liquid crystal electro-optical device and the like.

Example 2

Figure 12A:
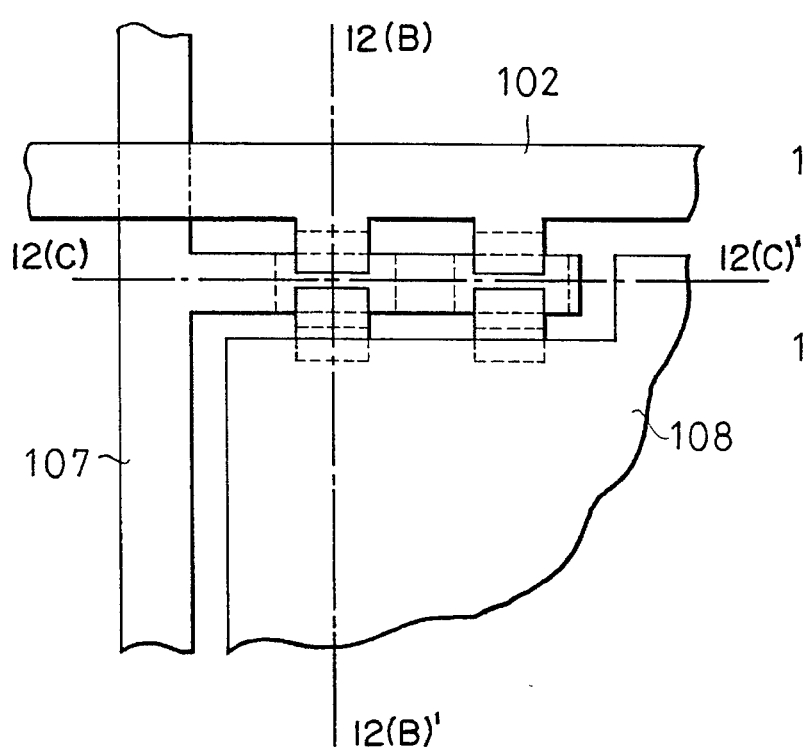
FIGS. 12(A)–12(C) Are a schematic diagram showing the arrangement state of complementary TFTs of the present invention, in case where the TFTs are applied to a liquid crystal electro-optical device.
Figure 12B:
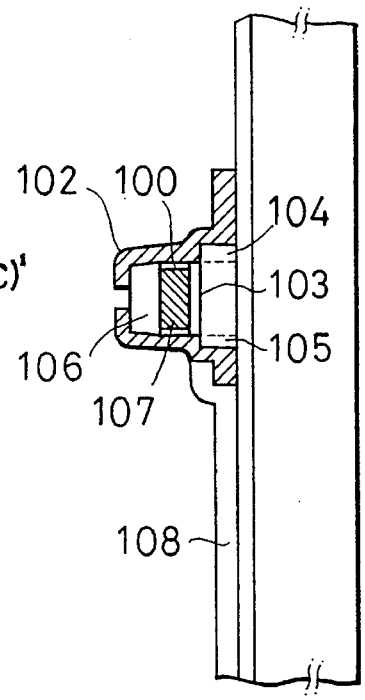
Figure 12C:
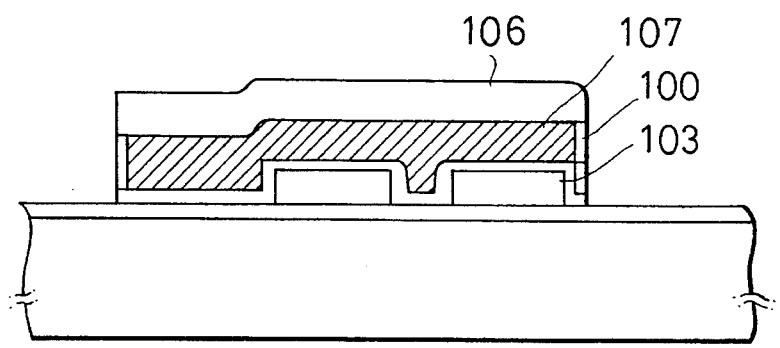

In this Example, the present invention was applied to the liquid crystal electro-optical device, in which modified transfer gate TFTs of complementary type constitution were prepared to a picture element. The preparation method of TFT according to this Example was basically the same with that of Example 1, and the preparation process followed in the same way with FIG. 8. But in this Example, C/TFTs of the modified transfer gate were used, then its arrangement was different from that of FIG. 8. Actually, TFTs were arranged and connected as shown in FIG. 12.

Figure 10:
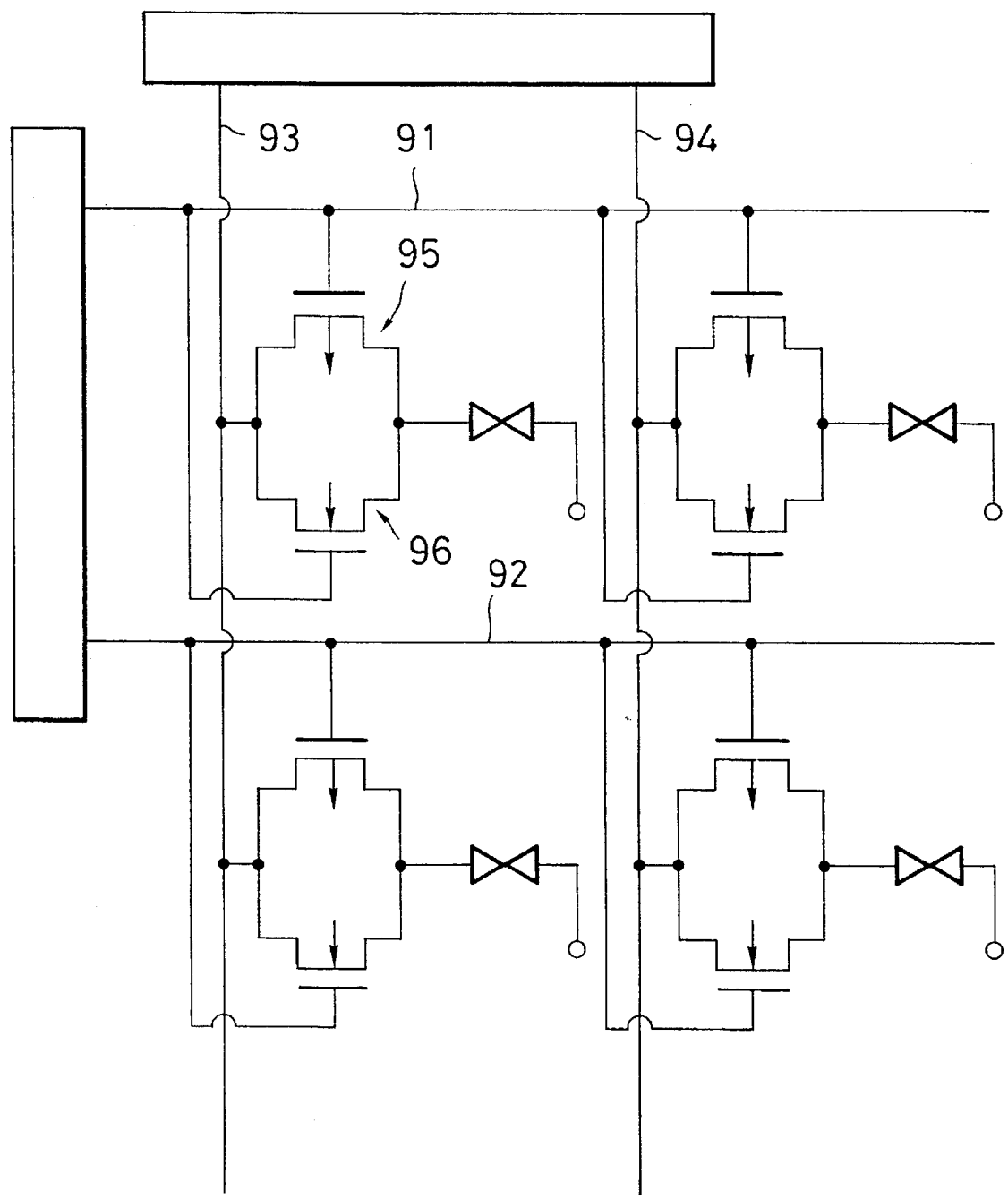
FIG. 10 is a schematic diagram of the circuit, in case where complementary TFTs of the present invention are applied to a liquid crystal electro-optical device.
Figure 11A:
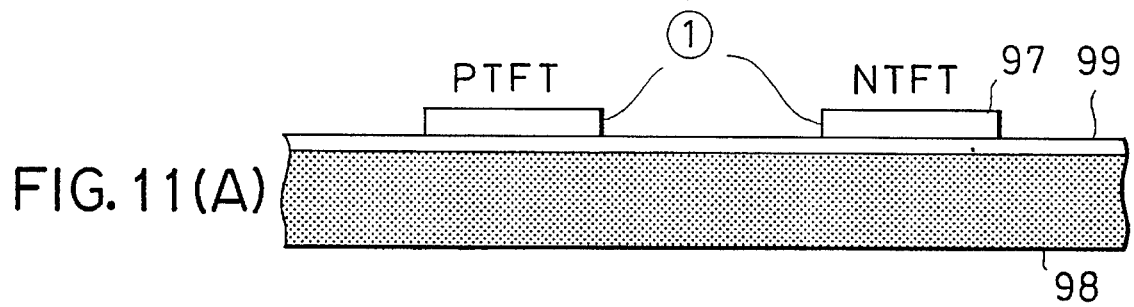
FIGS. 11(A)–11(G) Are a schematic cross-sectional view showing the preparing process of complementary TFTs of the present invention, in case where the TFTs are applied to a liquid crystal electrooptical device.
Figure 11B:
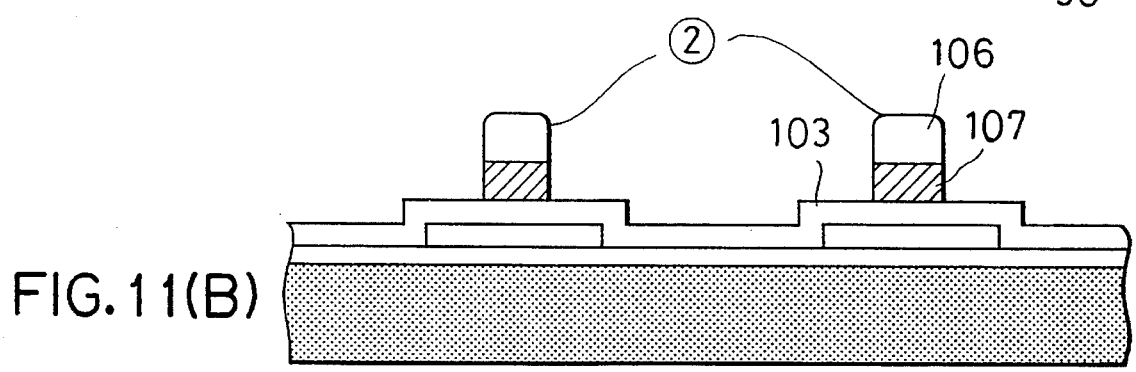
Figure 11C:
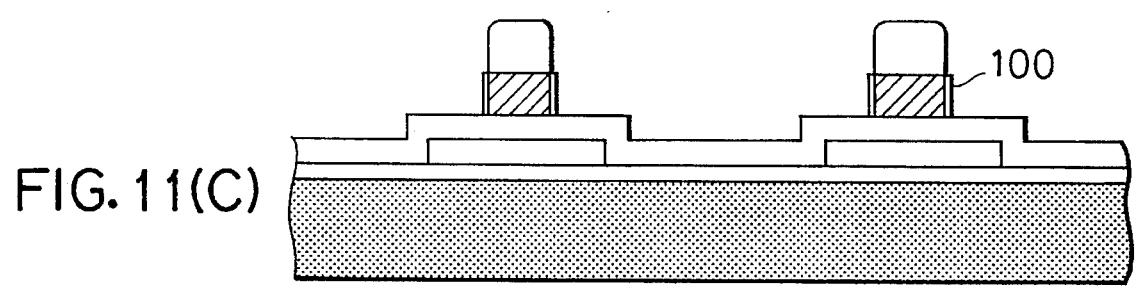
Figure 11D:
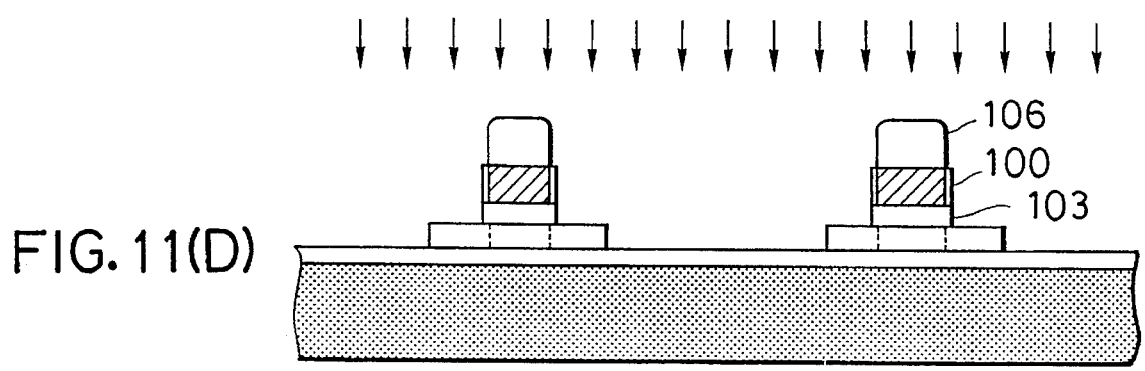
Figure 11E:
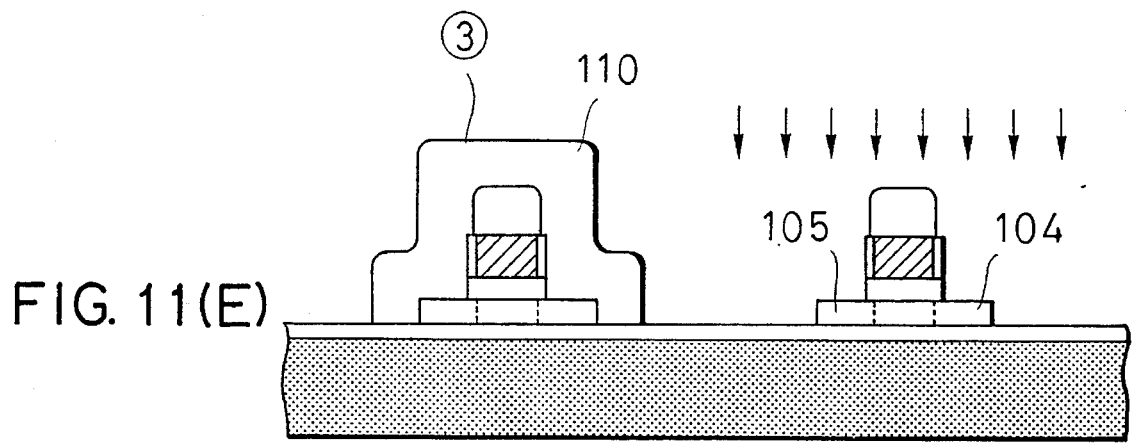
Figure 11F:
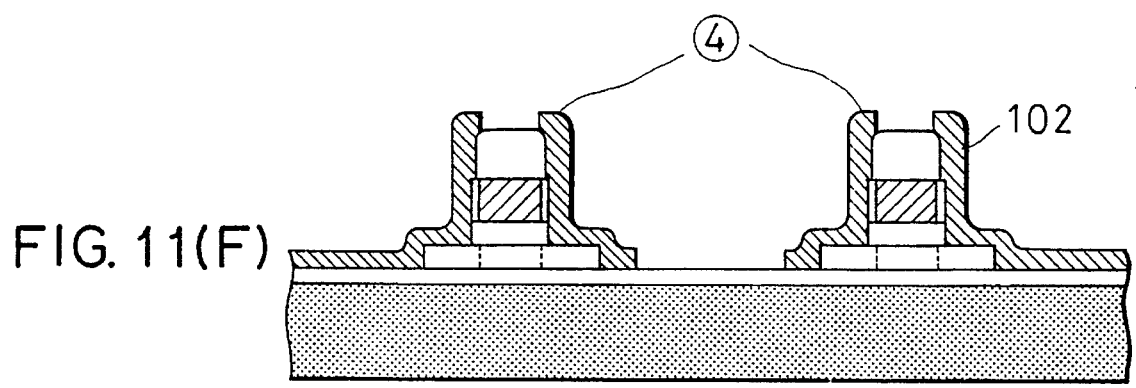
Figure 11G:
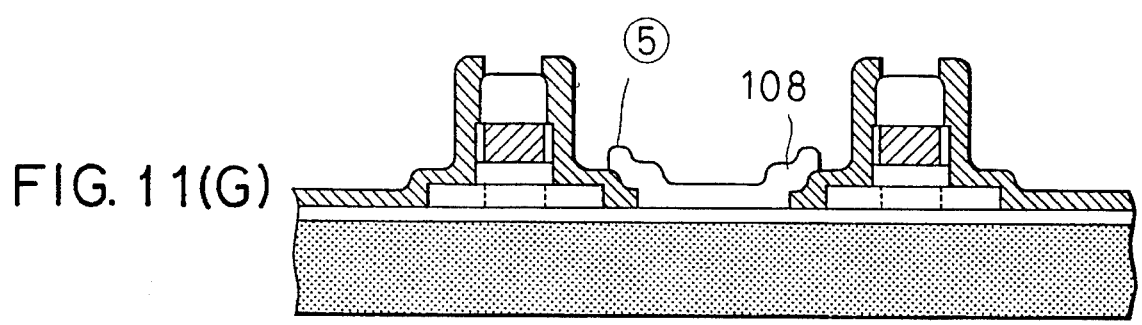

As indicated in FIG. 10, PTFT 95 and NTFT 96 are connected to the common gate wiring 91. One of source and drain terminals of the PTFT 95 and one of source and drain terminals of the NTFT 96 are connected to another signal line 93 and the other one of the source and drain terminals of the PTFT 95 and the other one of the source and drain terminals of the NTFT 96 are connected to a picture element electrode (pixel electrode). Firstly, a silicon oxide film as the blocking layer 99 was formed in 1000 to 3000 Å thick on the glass 98, by using a magnetron RF (High Frequency) sputtering method. The process conditions describe below. The atmosphere; 100% by weight oxygen, The film-forming temperature; 15° C., The output; 400 to 800 W, The pressure; 0.5 Pa, The film-forming speed using a quartz or a single crystal silicon as a target; 30 to 100 Å/min.

The silicon film 97 was formed on the blocking layer 99, using LPCVD (Low Pressure Chemical Vapor Deposition) method, sputtering method or plasma CVD method. As shown in FIG. 11 (A), the photo-etching of the silicon film was effected using the first photomask ①, to form the semiconductor region for PTFT at the left side of FIG. 11 and to form the semiconductor region for NTFT at the right side of FIG.11. These semiconductor regions were decided to become TFT regions, being different from the case of Example 1 where the first masking was roughly located because the TFT regions were decided again by the anisotropic etching in the later process.

On this silicon film, a silicon oxide film was formed in 500 to 2000 Å, e.g., in 700 Å thick as the gate insulation film 103. This forming was made in the same condition of the silicon oxide film 99 as the blocking layer. After that, on the upper side of this, an alloy of aluminum and silicon as a material for the gate electrode 107 was formed in 3000 Å to 1.5 µm, e.g., in 1 µm thick, using a usual sputtering method. As the gate electrode material, besides aluminum silicide, molybdenum (Mo), tungsten (W), titanium (Ti), tantalum (Ta), chrome (Cr), alloy of these materials mixed with silicon, alloy of these materials, and a lamination wiring comprising a silicon film and a metallic film and the like can be used.

Further, on this gate electrode material, a silicon oxide film as the insulation film 108 was formed in 3000 Å to 1 µm thick, actually here in 8000 Å thick, using the sputtering method. Then, the silicon oxide film and the gate electrode material were patterned with the second photomask ②, to form the gate electrode 107 and the insulation film 108, as shown in FIG. 11 (B).

Next, this substrate was dipped in the AGW electrolytic solution which was prepared by adding 9 parts by weight of propylene glycol in 1 part by weight of 3% by weight tartaric acid aqueous solution. The gate electrode of aluminum silicide was connected to the anode of electric power source, and D.C. power was applied using platinum as the cathode. At this time, all the gate wirings connected to the gate electrodes respectively were put into a connecting terminal around the end of the substrate. Anodic oxidation was then effected to form the anodic oxidation film 100 around the side of gate electrode as shown in FIG. 11 (C).

Next, as shown in FIG. 11 (D), the insulation film 103 on the semiconductor was removed by etching, and then 1 to $5 \times 10^{15}$ cm$^{-2}$ dose of boron as an impurity for PTFT was added to the whole area of the substrate, by ion implantation method. Source and drain regions for PTFT were then formed with their doping concentration of about $10^{19}$ cm$^{-3}$. In this Example, the ion doping was effected after removing the insulation film of surface, but it is possible to conduct a doping through the insulation film 103 on this semiconductor film, changing the condition of ion implantation.

Next, as shown in FIG. 11 (E), the photoresist 110 was formed using the third photomask ③, and PTFT region was covered. Then, 1 to $5\times10^{15}$ cm$^{-2}$ dose of phosphorus was added to the source and drain regions for NTFT by ion implantation method, so that the doping concentration reached to about $10^{20}$ cm$^{-3}$. The implantation was carried out in a slanting direction to the substrate in the above doping processes so that impurities reached areas under the anodic oxidation film and the end parts of the source and drain regions 104 and 105 were approximately aligned with the end parts of the gate electrode. In this way, it was not needed to form an insulation film newly, because the anodic oxidation film 100 had a sufficient insulating action to the electrode wiring which was formed in the later process.

Next, the source and drain regions were activated by a laser light radiation. In this case, it was not necessary to consider the diffusion of metallic material which was used in a gate electrode, since the activation treatment was effected instantaneously, and then high reliable TFT could be prepared.

Further, aluminum was formed on these whole area, by sputtering method, and the electrode lead 102 was formed by patterning with the fourth mask ④. Then, the semiconductor film protruded from the electrode 102, the insulation film 106 provided on the gate electrode 107, and the anodic oxidation film 100 was removed by etching, to completely separate circuit elements and to complete TFTs. By this preparation, TFTs of the complementary type constitution were obtained with the four sheets of mask. This situation is shown in FIG. 11 (F).

Next, ITO (Indium Tin Oxide film) was formed by sputtering method to connect a transparent electrode of a picture element (pixel) of a liquid crystal device with the output terminals of two TFTs in complementary structure as shown in FIG. 11 (G). This ITO was etched by the fifth photomask ⑤ to form the picture element electrode 108.

As described above, modified transfer gate TFTs having the arrangement and the structure indicated in FIGs.(A), (B), and (C) were completed. FIG. 12 (B) is a fragmentary cross-sectional view taken along the line F—F' of FIG. 12 (A), and FIG. 12 (C) is a fragmentary cross-sectional view taken in the line E—E' of FIG. (A). As evident in FIG. 12 (B) and FIG. 12 (C), the interlayer insulating film 108 exists certainly on the gate electrode 107, so that it was possible to control the wiring capacity generation at a cross over part, by effecting sufficient insulation at the cross over part between the lead of gate wiring 107 and the lead of source, drain wiring 102 by the interlayer insulating film.

According to this Example, an active circuit element substrate having such circuit element structure of TFT as less in the capacity around the wiring and less in the short circuit around the gate insulation film, can be completed with the same number of sheet of mask with that of Example 1, without using a high level process technology concerning an anisotropic etching process.

Using this substrate as the first substrate, and also using the second substrate which was composed of the opposed substrate, the opposed electrode, and the orientation control layer, an active matrix type STN liquid crystal electro-optical device was completed, by joining the first and second substrates with each other and introducing STN type liquid crystal between the substrates with a conventional technology.

In the aforementioned Examples, each is related to the applications to the liquid crystal electro-optical device. But the present invention is not limited to these Examples, and it can be appreciated that the present invention can be applicable to another devices, three dimensional IC element, and the like.

In accordance with the structure of the present invention, it is possible to prepare TFT circuit element using very few sheets of mask, compared with the conventional method. In the preparation of semiconductor products, using the circuit element of this structure according to the present invention, it is possible to simplify the preparation process, and to raise the preparation yield, as the mask number decreases. Hence, the preparation cost of the semiconductor products can be reduced.

The present invention is characterized in that an oxide film is formed on the surface of gate electrode, by oxidizing a metallic material of the gate electrode by anodic oxidation method, and also a three dimensional wiring, which has a three dimensional crossing, is prepared.

Further, feeding points can be approached to the channel by exposing only the contacting parts of source and drain from the gate electrode and the anodic oxidation film. By the approach, the falling of frequency characteristics and the increase of ON resistance can be avoided.

Still further, in case where aluminum is used as the gate electrode, hydrogen in the gate oxide film can be changed from $H_2$ to $H$ to reduce the hydrogen, by the catalytic action of aluminum in the annealing process of circuit element preparation, thus making it possible to decrease the interface state density ($Q_{SS}$ compared with the case where silicon gate is used, and to raise properties of the circuit element.

Still more further, it is possible to cut down the area required for the circuit element of TFT, and to raise an integration degree of TFT, by effecting the self-alignment of source and drain regions of TFT and also by locating the contacting parts of electrodes which supplies the source and drain regions with electric current, by using self-alignment. Also it is possible to raise the aperture ratio of liquid crystal panel, in case where TFT is used as the active circuit element of liquid crystal electro-optical device. Moreover, it is proposed that TFT having a characteristic structure can be obtained, by positively using the anodic oxidation film around the side of gate electrode, and it is possible to prepare this TFT with very few masks, e.g., two sheets of mask at the minimum.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. Examples of such modifications are as follows.

Figure 13:
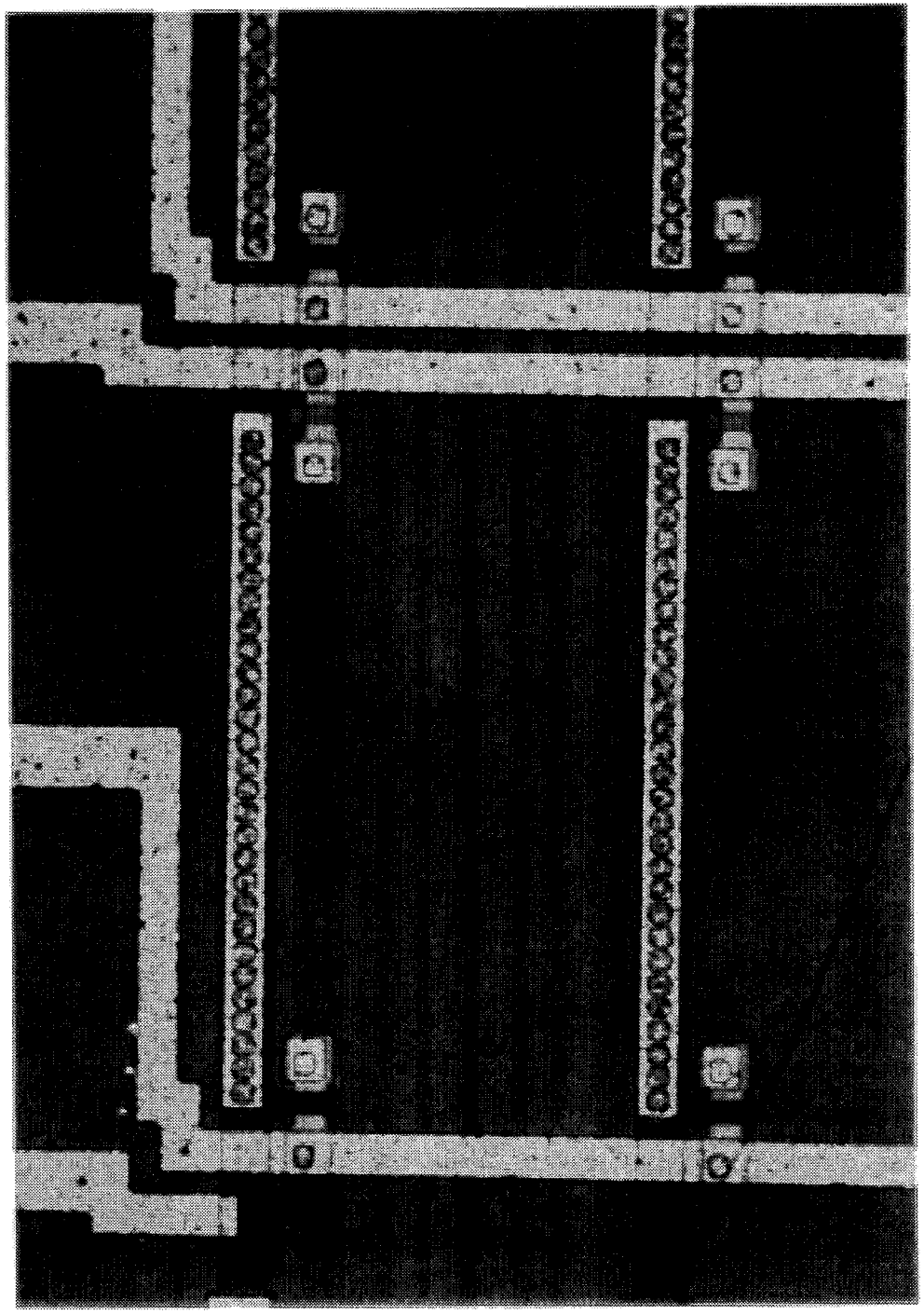
FIG.13 is a copy of a photograph showing an electric circuit in accordance with the present invention.

FIG. 13 is a copy of a photograph showing an electric circuit formed in accordance with the present invention. A circuit diagram of this electric circuit is the same as that shown in FIG. 7. Actual structure of this electric circuit is similar to, but a little different from, structure shown in FIG. 9. The difference is, for example, shape of signal lines 72, 73, 74, and 75.

Figure 14:
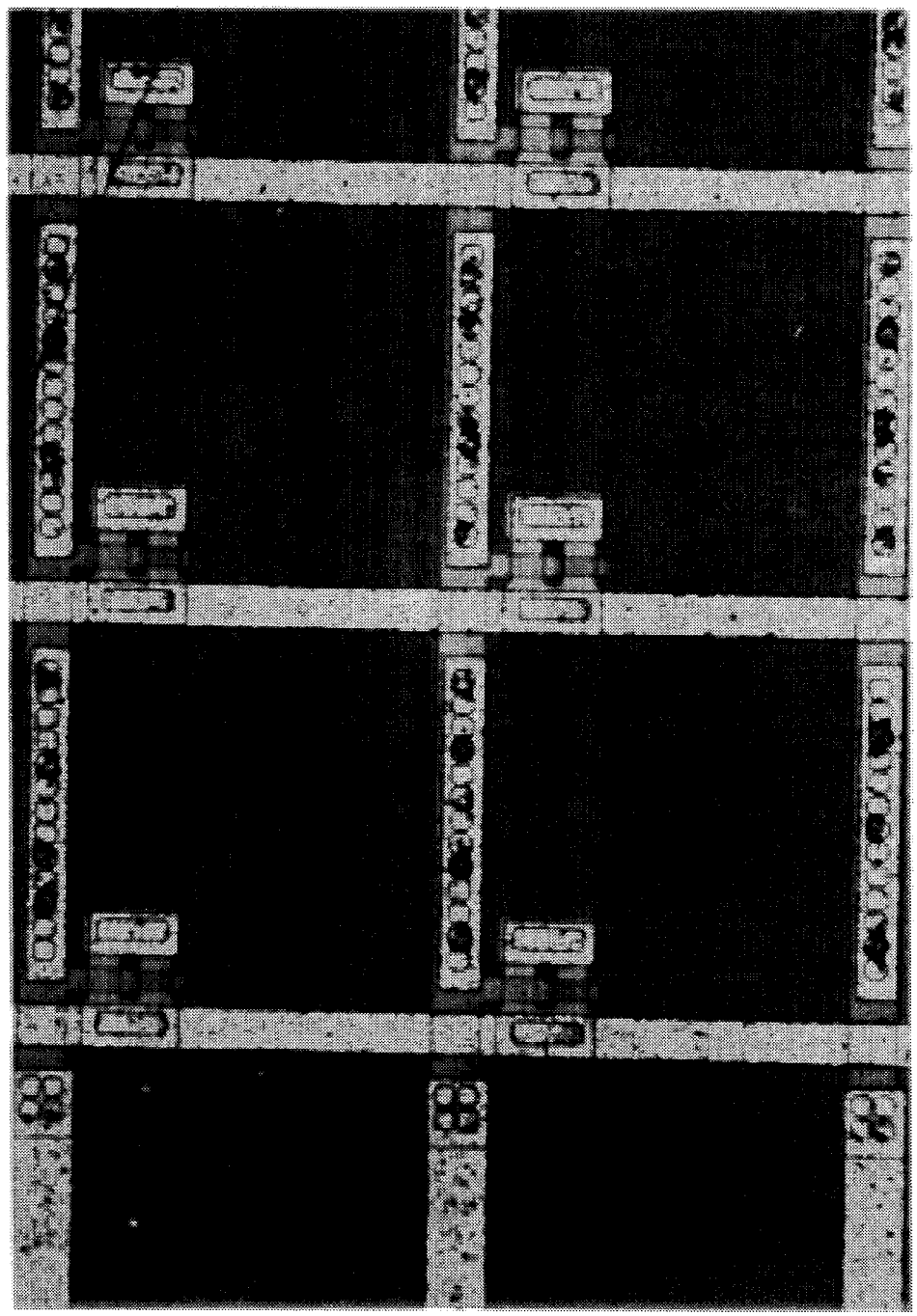
FIG. 14 is a copy of another photograph showing an electric circuit in accordance with the present invention.

FIG. 14 is a copy of another photograph showing an electric circuit formed in accordance with the present invention. A circuit diagram of this electric circuit is the same as that shown in FIG. 10. Actual structure of this electric circuit is similar to, but a little different from, structure shown in FIG. 12(A). The difference is, for example, location of TFTs.

What is claimed is:

1. A method for forming a complementary transistor pair comprising a p-channel thin film transistor and an n-channel thin film transistor, comprising the steps of:

forming a pair of semiconductor islands on an insulating surface of a substrate;

forming gate insulating layers on said semiconductor islands;

forming gate electrodes on said gate insulating layers;

oxidizing at least side surfaces of said gate electrodes by anodic oxidation to form an anodic oxide layer on at least the side surfaces of the gate electrodes;

introducing a first impurity having a first conductivity type to portions of both of said semiconductor islands with said gate electrodes and said anodic oxide layer thereon used as a mask to form pairs of impurity regions having the first conductivity type in said semiconductor islands;

forming a mask over one of said semiconductor islands, and the corresponding one of the gate electrodes formed thereon; and introducing a second impurity having a second conductive type to portions of the other one of the semiconductor islands with the gate electrode and the anodic oxide thereof formed on the other one of the semiconductor islands used as a mask in order to form a pair of impurity regions having the second conductivity type therein;

wherein channel regions are formed between said impurity regions in each of the semiconductor islands and each boundary between the channel region and the impurity regions is substantially aligned with outer edges of the anodic oxide layer of the gate electrodes.

2. The method of claim 1 further comprising the step of irradiating said semiconductor islands in order to activate said first and second impurities.

3. A method for forming a complementary transistor pair comprising a p-channel thin ilhn transistor and an n-channel thin film transistor, comprising the steps of:

forming a pair of semiconductor islands on an insulating surface of a substrate;

forming gate insulating layers on said semiconductor islands;

forming gate electrodes on said gate insulating layers;

oxidizing at least side surfaces of said gate electrodes by anodic oxidation to form an anodic oxide layer on at least the side surfaces of the gate electrodes;

introducing a first impurity having a first conductivity type to portions of both of said semiconductor islands with said gate electrodes and said anodic oxide layer thereon used as a mask to form pairs of impurity regions having the first conductivity type in said semiconductor islands;

forming a mask over one of said semiconductor islands, and the corresponding one of the gate electrodes formed thereon; and introducing a second. impurity having a second conductive type to portions of the other one of the semiconductor islands with the gate electrode and the anodic oxide thereof formed on the other one of the semiconductor islands used as a mask in order to form a pair of impurity regions having the second conductivity type therein where the concentration of said first impurity contained in the other one of the semiconductor islands is smaller than the concentration of said second impurity;

wherein channel regions are formed between said impurity regions in each of the semiconductor islands and each boundary between the channel region and the impurity regions is substantially aligned with outer edges of the anodic oxide layer of the gate electrodes.

4. The method of claim 2 wherein said semiconductor islands are irradiated with a laser light in said irradiating step in order to activate said first and second impurities.

5. The method of claim 2 wherein the second conductivity type is opposite to the first conductivity type.

6. The method of claim 4 wherein the second conductivity type is opposite to the first conductivity type.

7. The method of claim 1 wherein said gate electrodes comprise a material selected from the group consisting of aluminum, molybdenum, tungsten, titanium, tantalum and a combination thereof.

8. The method of claim 3 wherein said gate electrodes comprise a material selected from the group consisting of aluminum, molybdenum, tungsten, titanium, tantalum and a combination thereof.

9. A method for manufacturing an electro-optical device comprising the steps of:

forming a pair of semiconductor islands on an insulating surface of a substrate;

forming gate insulating layers on said semiconductor islands;

forming gate electrodes on said gate insulating layer;

oxidizing at least side surfaces of said gate electrodes by anodic oxidation to form an anodic oxide layer on at least the side surfaces of the gate electrodes;

introducing a first impurity having a first conductivity type to portions of both of said semiconductor islands with said gate electrodes and said anodic oxide layer thereon used as a mask to form pairs of impurity regions having the first conductivity type in said semiconductor islands;

forming a mask over one of said semiconductor islands, and the corresponding one of the gate electrodes formed thereon; and introducing a second impurity having a second conductivity type to portions of the other one of the semiconductor islands with the gate electrode and the anodic oxide thereof formed on the other one of the semiconductor islands used as a mask in order to form a pair of impurity regions having the second conductivity type therein where the concentration of said first impurity contained in the other one of the semiconductor islands is smaller than the concentration of said second impurity;

wherein channel regions are formed between said impurity regions in each of the semiconductor islands and each boundary between the channel region and the impurity regions is substantially aligned with outer edges of the anodic oxide layer of the gate electrodes.

10. The method of claim 9 wherein said device is a liquid crystal device.

* * * * *